(12) United States Patent
Jin

(10) Patent No.: US 12,414,391 B2
(45) Date of Patent: Sep. 9, 2025

(54) IMAGE SENSOR, CAMERA DEVICE INCLUDING THE IMAGE SENSOR, ELECTRONIC DEVICE INCLUDING THE CAMERA DEVICE, AND METHOD OF MANUFACTURING THE IMAGE SENSOR

(71) Applicant: SAMSUNG ELECTRONICS CO., LTD., Suwon-si (KR)

(72) Inventor: Younggu Jin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 641 days.

(21) Appl. No.: 17/741,983

(22) Filed: May 11, 2022

(65) Prior Publication Data

US 2023/0071106 A1 Mar. 9, 2023

(30) Foreign Application Priority Data

Sep. 6, 2021 (KR) .......................... 10-2021-0118262

(51) Int. Cl.
*H10F 39/00* (2025.01)
*H10F 39/18* (2025.01)

(52) U.S. Cl.
CPC ......... *H10F 39/8023* (2025.01); *H10F 39/18* (2025.01); *H10F 39/8037* (2025.01); *H10F 39/8053* (2025.01); *H10F 39/8063* (2025.01)

(58) Field of Classification Search
CPC ......... H01L 27/14605; H01L 27/14612; H01L 27/14643; H01L 27/14621; H01L 27/14627; H01L 27/14603
See application file for complete search history.

(56) References Cited

U.S. PATENT DOCUMENTS

| | | |
|---|---|---|
| 8,748,945 B2 | 6/2014 | Shin |
| 9,288,380 B2 | 3/2016 | Nomura |
| 9,305,947 B2 | 4/2016 | Ihara |
| 9,609,250 B2 | 3/2017 | Lee et al. |
| 9,706,145 B2 | 7/2017 | Ishiwata |
| 10,276,616 B2 * | 4/2019 | Lin ..................... H10F 39/8053 |
| 10,566,380 B2 * | 2/2020 | Jung ................. H01L 21/76224 |
| 10,872,919 B2 | 12/2020 | Takizawa et al. |
| 11,412,166 B2 | 8/2022 | Fujita et al. |
| 11,417,699 B2 | 8/2022 | Lee et al. |

(Continued)

FOREIGN PATENT DOCUMENTS

| | | |
|---|---|---|
| KR | 10-2015-0101681 A | 9/2015 |
| KR | 10-2020-0126477 A | 11/2020 |

(Continued)

OTHER PUBLICATIONS

Communication dated Jul. 2, 2025, issued by the Korean Patent Office in Korean Application No. 10-2021-0118262.

*Primary Examiner* — Herve-Louis Y Assouman
(74) *Attorney, Agent, or Firm* — Sughrue Mion, PLLC

(57) ABSTRACT

Provided is an image sensor including a light sensing element in a substrate, a plurality of transfer gates (TGs) spaced apart from each other in a horizontal direction substantially parallel to a surface of the substrate, each of the plurality of TGs extending through a portion of the substrate and contacting the light sensing element, and a floating diffusion (FD) region on a portion of the substrate adjacent to the plurality of TGs, wherein the FD region is between the plurality of TGs in a plan view.

19 Claims, 25 Drawing Sheets

(56) References Cited

U.S. PATENT DOCUMENTS

| | | |
|---|---|---|
| 11,581,347 B2 | 2/2023 | Kim et al. |
| 2019/0296060 A1 | 9/2019 | Oh |
| 2020/0203416 A1* | 6/2020 | Jin .................... H01L 27/14614 |
| 2021/0134865 A1 | 5/2021 | Shim et al. |

FOREIGN PATENT DOCUMENTS

| | | |
|---|---|---|
| KR | 10-2020-0145978 A | 12/2020 |
| KR | 10-2021-0022306 A | 3/2021 |

* cited by examiner

IMAGE SENSOR, CAMERA DEVICE INCLUDING THE IMAGE SENSOR, ELECTRONIC DEVICE INCLUDING THE CAMERA DEVICE, AND METHOD OF MANUFACTURING THE IMAGE SENSOR

CROSS-REFERENCE TO RELATED APPLICATION

This application claims priority to Korean Patent Application No. 10-2021-0118262, filed on Sep. 6, 2021 in the Korean Intellectual Property Office, the disclosure of which is incorporated herein by reference in its entirety.

BACKGROUND

1. Field

Example embodiments of the present disclosure relate to an image sensor, a camera device including the image sensor, an electronic device including the camera module, and a method of manufacturing the image sensor.

2. Description of Related Art

In order to secure a high dynamic range, an image sensor may have a split pixel structure including a main pixel region having a relatively large area and a sub pixel region having a relatively small area. In this case, photodiodes (PDs) in the main pixel region and the sub pixel region, respectively, may have different areas, and the PDs may not have optimized doping concentrations by the same doping process. Thus, the efficiency of charge transfer from the PDs to floating diode (FD) regions may be deteriorated.

SUMMARY

One or more example embodiments provide an image sensor having improved characteristics.

One or more example embodiments also provide a camera device including the image sensor having improved characteristics.

One or more example embodiments also provide an electronic device including the camera device having improved characteristics.

According to an aspect of an example embodiment, there is provided an image sensor including a light sensing element in a substrate, a plurality of transfer gates (TGs) spaced apart from each other in a horizontal direction substantially parallel to a surface of the substrate, each of the plurality of TGs extending through a portion of the substrate and contacting the light sensing element, and a floating diffusion (FD) region on a portion of the substrate adjacent to the plurality of TGs, wherein the FD region is between the plurality of TGs in a plan view.

According to another aspect of an example embodiment, there is provided an image sensor including a light sensing element in a substrate, a transfer gate (TG) extending through a portion of the substrate and contacting the light sensing element, the TG having a ring shape in a plan view, and a floating diffusion (FD) region at a portion of the substrate adjacent to the TG, wherein the FD region is at an inside of the TG in a plan view.

According to another aspect of an example embodiment, there is provided an image sensor including a plurality of light sensing elements in a substrate, the plurality of light sensing elements being spaced apart from each other in a horizontal direction substantially parallel to a surface of the substrate, one or a plurality of transfer gates (TGs) spaced apart from each other, the one or each one of the plurality of TGs extending through a portion of the substrate and contacting the plurality of light sensing elements commonly or respectively, and a floating diffusion (FD) region at a portion of the substrate adjacent to the one or the plurality of TGs, wherein a cross-section of the FD region in a vertical direction substantially perpendicular to the surface of the substrate is at an inside of the one TG or between the plurality of TGs.

According to another aspect of an example embodiment, there is provided an image sensor including a first division pattern in a substrate, the first division pattern extending in a vertical direction substantially perpendicular to a surface of the substrate and having a first closed shape in a plan view, a plurality of second division patterns in the substrate, each of the plurality of second division patterns extending in the vertical direction and extending toward an inside of the first closed shape in a plan view, a third division pattern in the substrate, the third division pattern extending in the vertical direction and extending toward an outside of the first closed shape, the third division pattern together with a portion of the first division pattern having a second closed shape in a plan view, and the second closed shape having an area less than that of the first closed shape, a plurality of light sensing elements in the substrate, the plurality of light sensing elements being in first regions, respectively, the first regions corresponding to the first division pattern and the second division pattern, a plurality of first transfer gates (TGs) spaced apart from each other in a horizontal direction substantially parallel to the surface of the substrate, each of the plurality of TGs extending through a portion of the substrate and contacting the plurality of light sensing elements, a floating diffusion (FD) region at a portion of the substrate adjacent to the plurality of TGs, the FD region being between the plurality of TGs in a plan view, a second light sensing element in a second region corresponding to the first division pattern and the third division pattern, a second TG extending through a portion of the substrate and contacting the second light sensing element, and a second FD region at a portion of the substrate adjacent to the second TG.

According to another aspect of an example embodiment, there is provided an image sensor including a first substrate, a first insulating interlayer on the first substrate, the first insulating interlayer containing first wirings, a second insulating interlayer on the first insulating interlayer, the second insulating interlayer containing second wirings, a second substrate on the second insulating interlayer, a light sensing element in the second substrate, a plurality of transfer gates (TGs) spaced apart from each other in a horizontal direction substantially parallel to a surface of the second substrate, each of the plurality of TGs extending through a lower portion of the second substrate and contacting a lower surface of the light sensing element, a floating diffusion (FD) region at a lower portion of the second substrate adjacent to the plurality of TGs, the FD region being between the plurality of TGs in a plan view, a lower planarization layer on the second substrate, a color filter array layer on the lower planarization layer, the color filter array layer including a plurality of color filters, a microlens on the color filter array layer, a transparent protection layer on the microlens, a pad extending through the lower planarization layer and an upper portion of the second substrate, and a through via structure extending through the lower planarization layer, the second substrate, the second insulating interlayer, and an upper portion of the first insulating interlayer, the through via structure commonly contacting the first wiring and the second wiring.

According to another aspect of an example embodiment, there is provided a camera device including a prism configured to change a path of a light incident from an outside by reflecting the incident light, an optical path folding element (OPFE) configured to change an optical zoom ratio of the reflected light from the prism, an image sensing device configured to sense an image of an object based on the light incident from the OPFE, and a storage device configured to store image data generated from the image sensing device, wherein the image sensing device includes a light sensing element in a substrate, a plurality of transfer gates (TGs) spaced apart from each other in a horizontal direction substantially parallel to a surface of the substrate, each of the plurality of TGs extending through a portion of the substrate and contacting the light sensing element, and a floating diffusion (FD) region at a portion of the substrate adjacent to the plurality of TGs, wherein the FD region is between the plurality of TGs in a plan view.

According to another aspect of an example embodiment, there is provided an electronic device including a camera device configured to sense an object to generate image data, an application processor (AP) configured to receive and process the image data generated from the camera device, a power management integrated circuit (PMIC) configured to provide a power supply voltage to the camera device, and an external memory configured to store the image data processed by the AP, wherein the camera device includes an image sensing device configured to sense an image of an object based on a light reflected from the object, wherein the image sensing device includes a light sensing element in a substrate, a plurality of transfer gates (TGs) spaced apart from each other in a horizontal direction substantially parallel to a surface of the substrate, each of the plurality of TGs extending through a portion of the substrate and contacting the light sensing element, and a floating diffusion (FD) region at a portion of the substrate adjacent to the plurality of TGs, and wherein the FD region is between the plurality of TGs in a plan view.

BRIEF DESCRIPTION OF THE DRAWINGS

The above and/or other aspects will be more apparent by describing example embodiments, taken in conjunction with the accompanying drawings, in which.

DESCRIPTION OF EMBODIMENTS

Image sensors, camera devices including the image sensors, electronic devices including the camera devices, and methods of manufacturing the image sensors in accordance with example embodiments will be more clearly understood from the following detailed description taken in conjunction with the accompanying drawings.

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

A direction substantially parallel to a surface of a reference substrate or a first substrate and/or a second substrate may be referred to as a horizontal direction, and a direction substantially perpendicular to the surface of the reference substrate or the first substrate and/or the second substrate may be referred to as a vertical direction. In the specifications, up vs. down, on and over vs. beneath and under, upper surface vs. lower surface, and upper portion vs. lower portion are relative conceptions so as to describe opposite sides in the vertical direction, and each wording may have opposite meanings according to the specific parts to be explained in the specifications.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
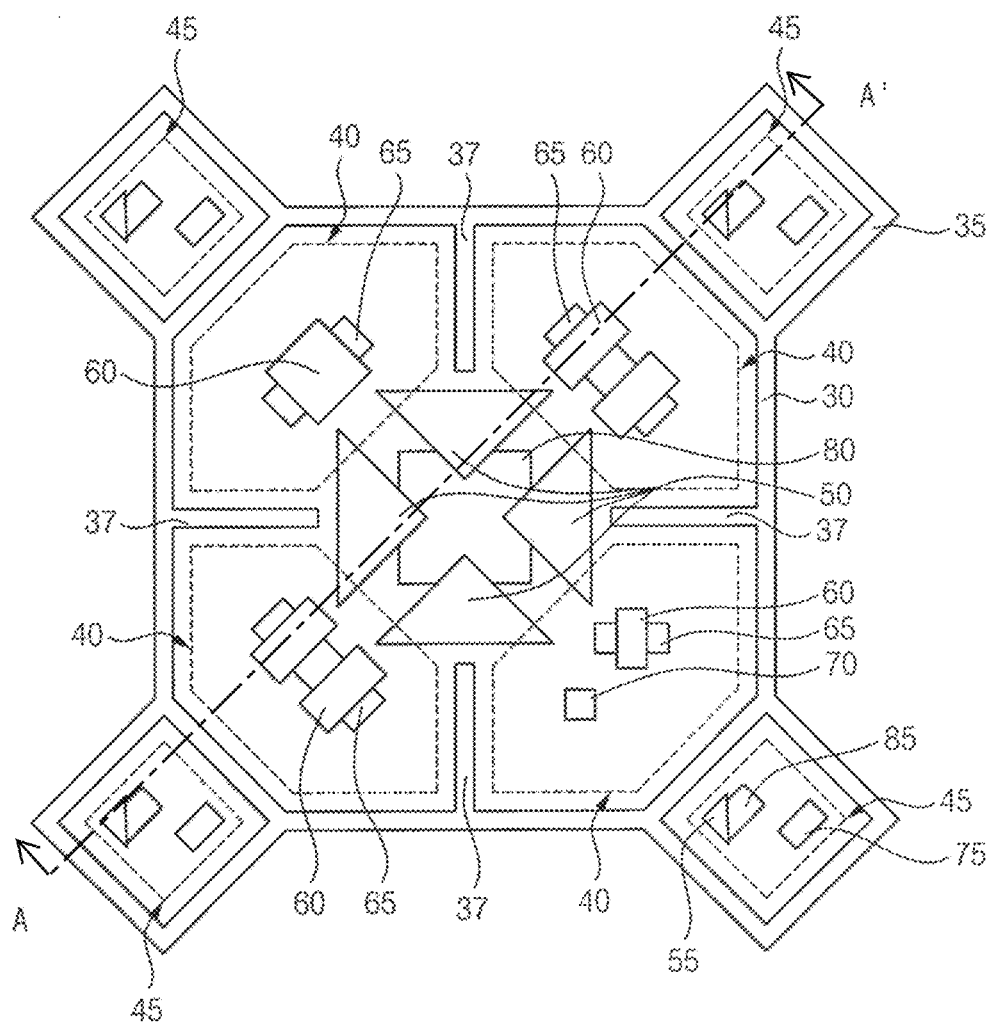
FIG. 1 is a plan view illustrating a pixel included in an image sensor.
Figure 2:
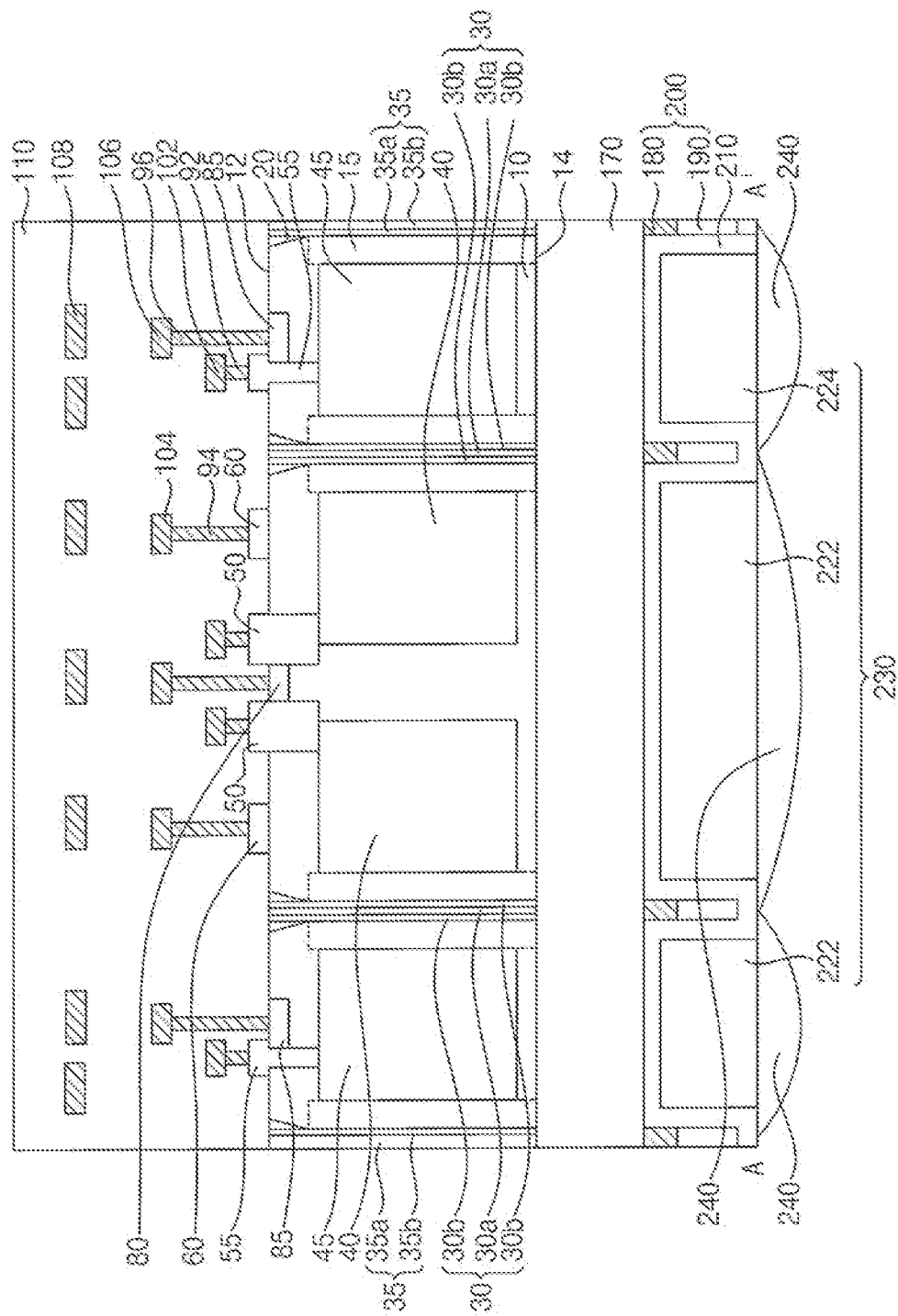
FIGS. 2 and 3 are cross-sectional views taken along line A-A' of FIG. 1.
Figure 3:
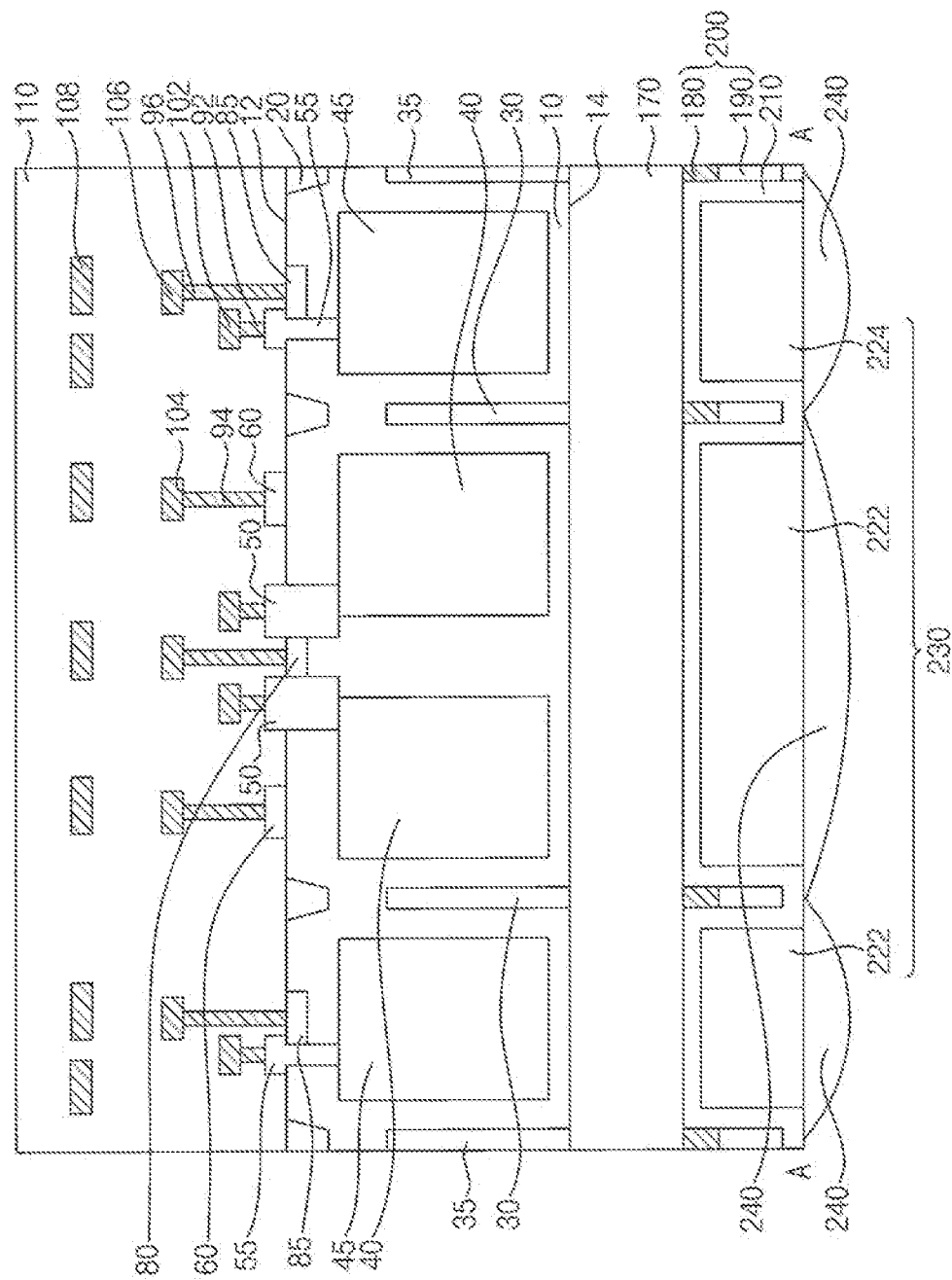

FIG. 1 is a plan view illustrating a pixel included in an image sensor, and FIGS. 2 and 3 are cross-sectional views taken along line A-A' of FIG. 1.

Referring to FIGS. 1 and 2, the image sensor may include a first division pattern 30, a second division pattern 35, and a third division pattern 37 each of which may extend in the vertical direction through a first substrate 10.

The first division pattern 30 may have a first closed shape in a plan view. The second division pattern 35 may be connected with the first division pattern 30, and may be disposed at an outside of the first closed shape and may form a second closed shape together with a portion of the first division pattern 30. The third division pattern 37 may be connected with the first division pattern 30, and may extend from the first closed shape toward a center of the first closed shape.

FIG. 1 shows an octagon as an example of the first closed shape and a rectangle as an example of the second closed shape. However, embodiments are not limited thereto. Thus, each of the first closed shape and the second closed shape may be any type of closed figure, e.g., a polygon or a closed curve. FIG. 1 shows four third division patterns 37 spaced apart from each other in the horizontal direction. However, embodiments are not limited thereto, and the number of the third division pattern 37 may not be limited thereto.

In example embodiments, the first division pattern 30 may define a unit pixel region in which a unit pixel is formed. For example, elements included in each unit pixel may be formed in a main pixel region having the first closed shape that may be formed by the first division pattern 30. However, some of the elements of the unit pixel, e.g., a light sensing element, a transfer gate (TG), a floating diffusion (FD) region, a color filter, a microlens, etc., may be formed in a sub pixel region having the second closed shape that may be formed by the second division pattern 35 and the portion of the first division pattern 30. In example embodiments, a plurality of unit pixel regions each of which may be defined by the first division pattern 30 and the second division pattern 35 may be spaced apart from each other in the horizontal direction.

In example embodiments, in a plan view, a first area of the main pixel region may be greater than a second area of the sub pixel region. However, embodiments are not limited thereto. For example, a third area of an edge region that may be formed by neighboring ones of the third division patterns 307 in the horizontal direction and the portion of the first division pattern 30 may be similar to or not much larger than the second area of the sub pixel region.

For example, the main pixel region may include a central region in which the third division patterns 37 are formed and the edge region that may be defined by the first division pattern 30 and the third division pattern 37, and thus the first area may be the sum of the third areas of the edge regions and a fourth area of the central region. Thus, the third area may be similar to or not much larger than the second area.

In example embodiments, each of the first division pattern 30, the second division pattern 35, and the third division pattern 37 may include a core extending in the vertical direction and a shell covering a sidewall of the core. For example, the first division pattern 30 may include a first core 30a and a first shell 30b, the second division pattern 35 may include a second core 35a and a second shell 35b, and the third division pattern 37 may include a third core and a third shell. Each of the first division pattern 30, the second division pattern 35, and the third division pattern 37 may further include a cover layer covering a lower surface and/or an upper surface of the core.

The core may include a metal, e.g., aluminum, copper, tungsten, titanium, etc., or polysilicon, and the shell may include, e.g., silicon oxide.

In example embodiments, the first substrate 10 may include silicon, germanium, silicon-germanium, or a III-V group compound semiconductor, such as gallium phosphide (GaP), gallium arsenide (GaAs), or gallium antimonide (GaSb). In example embodiments, a p-type well doped with p-type impurities may be formed partially or entirely in the first substrate 10. The first substrate 10 may include first surface 12 and a second surface 14 opposite to each other in the vertical direction, and the first surface 12 and the second surface 14 are shown as upper and lower surfaces, respectively, in FIG. 2.

An isolation pattern 20 may be formed at a portion of the first substrate 10 adjacent to the first surface 12, for example, at an upper portion of the first substrate 10, and upper sidewalls of the first division pattern 30, the second division pattern 35, and the third division pattern 37 may be covered by the isolation pattern 20. The isolation pattern 20 may include an oxide, e.g., silicon oxide.

Each unit pixel may include a first light sensing element 40, a first TG 50, first to third transistors, a first ground electrode 70, a first FD region 80, a first color filter 222 and a microlens 240 in the main pixel region may be formed by the first division pattern 30. However, the image sensor may have the split pixel structure, and thus a second light sensing element 45, a second TG 55, a second ground electrode 75, a second FD region 85, the color filter array layer 230 and the microlens 240 may be formed in the sub pixel region that may be formed by the first division pattern 30 and the second division pattern 35.

The image sensor may further include a first planarization layer 170 beneath the second surface 14 of the first substrate 10, for example, beneath the lower surface of the first substrate 10, an interference blocking structure 200 that may divide the first color filter 222 and the second color filter 224, and a first insulating interlayer 110 on the first surface 12 of the first substrate 10 and containing first via 92, a second via 94, and a third via 96 and a first wiring 102, a second wiring 104, a third wiring 106, and a fourth wiring 108 therein. A highly doped impurity region 15 in which e.g., p-type impurities are highly doped may be formed at a portion of the first substrate 10 adjacent to each of the first division pattern 30, the second division pattern 35, and the third division pattern 37.

In example embodiments, each of the first light sensing element 40 and the second light sensing element 45 may be a portion of a photodiode (PD). For example, each of the first light sensing element 40 and the second light sensing element 45 may be a region that may be doped with n-type impurities at an inside of the p-type well in the first substrate 10. Thus, each of the first light sensing element 40 and the second light sensing element 45 and the p-type well may form a PN junction diode. However, in example embodiments, the highly doped impurity region 15 may be formed at the portion of the first substrate 10 adjacent to each of the first division pattern 30, the second division pattern 35, and the third division pattern 37, and thus the PN junction diode may have enhanced characteristics.

In example embodiments, the first light sensing element 40 may be formed at the edge region defined by the first division pattern 30 and the third division pattern 37. Thus, a plurality of first light sensing elements 40 may be spaced apart from each other by the third division patterns 37 in the main pixel region.

The first TG 50 may extend through an upper portion of the first substrate 10 to contact an upper surface of the first light sensing element 40, and may be formed in the central region of the main pixel region. In example embodiments, a plurality of first TGs 50 may be spaced apart from each other in the horizontal direction.

In an example embodiment, the number of the first TG 50 may be the same as the number of the first light sensing element 40 in the main pixel region. FIG. 1 shows that four first TGs 50 are formed in the main pixel region, and each of the first TGs 50 commonly contacts neighboring two first light sensing elements 40 among the four light sensing elements 40. However, embodiments are not limited thereto. For example, the number of the first TG 50 may be less or more than the number of the first light sensing elements 40 in the main pixel region, and each of the first TGs 50 may contact one or more than two first light sensing elements 40.

In example embodiments, the first TG 50 may include a buried portion extending from the first surface 12 of the first substrate 10 downwardly in the vertical direction, and a protruding portion on the buried portion and having an upper surface higher than the first surface 12 of the first substrate 10.

Each of the first to third transistors may be formed in the edge region of the main pixel region. Each of the first to third transistors may include a gate 60 and a source/drain region 65 at an upper portion of the first substrate 10 adjacent to the gate 60. In example embodiments, the first to third transistors may be a reset transistor, a source follower transistor and a select transistor. The first TG 50, the first light sensing element 40 and the first FD region 80 may form a transfer transistor. The first light sensing element 40 may serve as a source region of the transfer transistor, and the first FD region 80 may serve as a drain region of the transfer transistor.

The first FD region 80 may be formed at an upper portion of the first substrate 10, and may be a region in which, e.g., n-type impurities are doped. In example embodiments, the first FD region 80 may be formed in the central region of the main pixel region, and may be formed between the first TGs 50 in a plan view.

The first planarization layer 170 may be formed beneath a plurality of pixels disposed in the horizontal direction. The first planarization layer 170 may have a single layer or a multi-layered structure including a plurality of layers sequentially stacked in the vertical direction. The first planarization layer 170 may include silicon oxide, silicon nitride, or a metal oxide, e.g., aluminum oxide, hafnium oxide.

A color filter array layer 230 may be formed beneath the first planarization layer 170 opposite to the first substrate 10, and may include a plurality of color filters divided by the interference blocking structure 200 that may correspond to the first division pattern 30 and the second division pattern 35 in the vertical direction. In example embodiments, the color filter array layer 230 may include a first color filter 222, a second color filter 224 and a third color filter. FIG. 2 shows the first and second color filters 222 and 224.

The first color filter 222, the second color filter 224 and the third color filter may be arranged in the horizontal direction beneath the first planarization layer 170. In example embodiments, the first color filter 222, the second color filter 224 and the third color filter may be a green filter G, a blue filter B and a red filter R, respectively. However, embodiments are not limited thereto.

In an example embodiment, the first color filter G, the second color filter B, and the third color filter R may be arranged in a Bayer pattern. One of the first color filter, the second color filter, and the third color filter R that may filter different colors from each other may be arranged in each pixel. According to another example embodiment, one of the first color filter G, the second color filter B, and the third color filter R may be arranged in a color filter group including a plurality of pixels neighboring with each other, which may form a tetra pixel.

In another example embodiment, the color filter array layer 230 may further include a fourth color filter that may be a white filter W, and the first color filter G, the second color filter B, the third color filter R, and the fourth color filter W may be arranged in the first direction and the second direction by various types of arrangements.

The interference blocking structure 200 may serve as a barrier that may block a light incident onto one pixel from moving to a neighboring pixel, so that light interference between neighboring pixels may be prevented.

In example embodiments, the interference blocking structure 200 may include a first interference blocking pattern 180 and a second interference blocking pattern 190 stacked in the vertical direction. The first interference blocking pattern 180 may include a metal nitride, e.g., titanium nitride, and the second interference blocking pattern 190 may include a metal having a relatively low light absorption rate, e.g., tungsten or a low refractive index material (LRIM), e.g., porous silicon oxide.

A protection layer 210 may be further formed beneath a lower surface and a sidewall of the interference blocking structure 200 and a lower surface of the first planarization layer 170. Thus, an upper surface and a sidewall of each of the first color filter 222, the second color filter 224 and the third color filter may be covered by the protection layer 210. The protection layer 210 may include a metal oxide, e.g., aluminum oxide.

A plurality of microlenses 240 may be formed beneath the color filter array layer 230 and the protection layer 210, and may condense light incident onto each pixel. In example embodiments, each of the microlenses 240 may be disposed beneath a corresponding one of the color filters included in each pixel. According to another example embodiment, each of the microlenses 240 may be commonly disposed on corresponding ones of the color filters included in neighboring pixels, respectively, e.g., ones of the color filters that may filter the same color.

The second light sensing element 45, the second TG 55 contacting an upper surface of the second light sensing element 45, the second FD region 85 at an upper portion of the first substrate 10, and the second ground electrode 75 may be formed in the sub pixel region defined by the first division pattern 30 and the second division pattern 35, and the color filter array layer 230 and the microlens 240 may be formed beneath the first planarization layer 170.

The first via 92 contacting the first TG 50 and the second TG 55, the second via 94 contacting the gate 60 included in each of the first to third transistors, the third via 96 contacting the first FD region 80 and the second FD region 85, the first wiring 102 connected to the first via 92, the second wiring 104 connected to the second via 94, the third wiring 106 connected to the third via 96, and the fourth wiring 108 at a higher level than the third wiring 106 may be formed in the first insulating interlayer 110 on the first surface 12 of the first substrate 10. FIG. 2 shows that the fourth wiring 108 is formed at one level. However, embodiments are not limited thereto. For example, the fourth wiring 108 may be formed at a plurality of levels.

The image sensor may have the split pixel structure including the main pixel region and the sub pixel region that may have different areas from each other so as to secure high dynamic range. Thus, the elements included in each unit pixel may be formed not only in the main pixel region having a relatively large area but also in the sub pixel region having a relatively small area.

However, the first light sensing element 40 may not be formed to have a relatively large area in the main pixel region, but may be formed in each of the edge regions that may be divided by the third division patterns 37, and may have a relatively small area that may be similar to or not much larger than that of the second light sensing element 45 in the sub pixel region. When light sensing elements that may have different areas from each other and the area difference is very large, the light sensing elements may not have optimized doping concentrations by the same doping process. Thus, the charge transfer characteristics from the light sensing elements to the FD region may be deteriorated.

However, in accordance with example embodiments, the main pixel region may be divided into the central region and the edge regions through the third division patterns 37, and the first light sensing element 40 may be formed in each of the edge regions having an area that may be similar to or not much larger than an area of the second light sensing element 45 in the sub pixel region. Thus, the first light sensing element 40 and the second light sensing element 45 may have optimized doping concentrations even with the same doping process, and the image sensor including the pixel may have a relatively high conversion gain (CG). Additionally, the highly doped impurity region 15 may be formed at portions of the first substrate 10 adjacent to the first division pattern 30, the second division pattern 35, and the third division pattern 37, so that a PN junction diode having enhanced characteristics may be formed.

Furthermore, in accordance with example embodiments, a plurality of first TGs 50 may be formed on the first light sensing elements 40 in the main pixel region, and the first FD region 80 may be formed between the plurality of first TGs 50 in a plan view. Thus, unlike a TG on a light sensing element and a FD region at a side of the TG, an electric field for transferring charges from the first light sensing element 40 to the overlying first FD region 80 may be formed by the plurality of first TGs 50 so that the electric field may be efficiently and strongly generated. As a result, the image sensor may have enhanced charge transfer characteristics.

FIG. 3 is a cross-sectional view illustrating an image sensor in accordance with example embodiments. This image sensor may be substantially the same as or similar to that of FIGS. 1 and 2, except for the first division pattern 30, the second division pattern 35, and the third division pattern 37 and the highly doped impurity region 15, and thus repeated explanations are omitted herein.

Referring to FIG. 3, each of the first division pattern 30, the second division pattern 35, and the third division pattern 37 may not entirely penetrate through the first substrate 10 in the vertical direction, but may extend through a lower portion and a middle portion of the first substrate 10 from the second surface 14 and may not extend through an upper portion of the first substrate 10.

In example embodiments, each of the first division pattern 30, the second division pattern 35, and the third division pattern 37 may not include the core and the shell including polysilicon and silicon oxide, respectively, but may include a metal oxide, e.g., aluminum oxide, hafnium oxide, tantalum oxide, etc., and may include a single layer or a multi-layered structure including a plurality of layers sequentially stacked. Each of the first division pattern 30, the second division pattern 35, and the third division pattern 37 including the metal oxide may include negative ions therein, and thus may have the same effect of doping p-type impurities at a portion of the first substrate 10 adjacent to each of the first division pattern 30, the second division pattern 35, and the third division pattern 37.

FIGS. 4 to 8 are plan views illustrating pixels included in an image sensor in accordance with example embodiments. The pixels may be substantially same as or similar to the pixel illustrated with reference to FIGS. 1 and 2, and thus repeated explanations are omitted herein.

Figure 4:
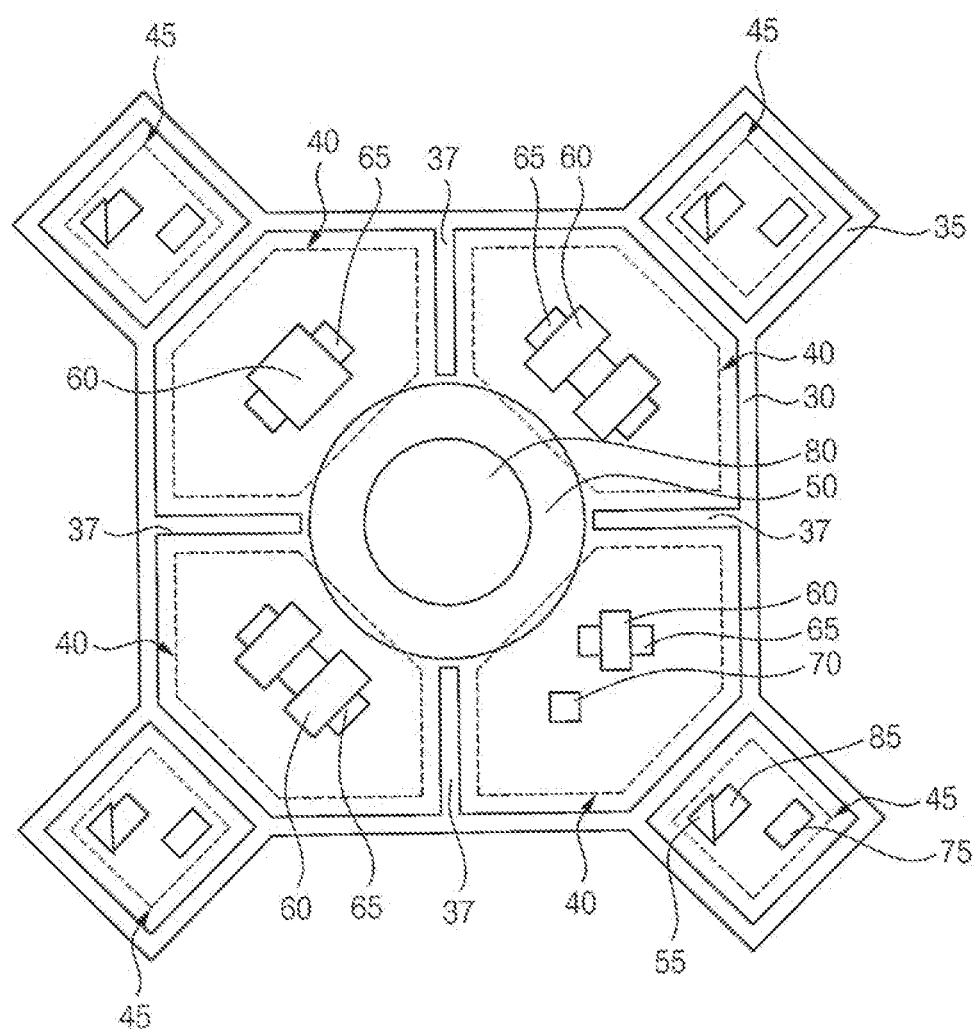
FIGS. 4, 5, 6, 7, and 8 are plan views illustrating pixels included in an image sensor in accordance with example embodiments.

Referring to FIG. 4, the first TG 50 may be formed in the central region of the main pixel region defined by the first division pattern 30, and may have a shape of a ring, e.g., a circular ring in a plan view.

FIG. 1 shows a plurality of first TGs 50 spaced apart from each other in the horizontal direction, while FIG. 4 shows one first TG 50 having the circular ring shape. However, the first TG 50 may have other shapes, e.g., a shape of an elliptic ring or polygonal ring.

The first TG 50 may commonly contact upper surfaces of the first light sensing elements 40, and the first FD region 80 may be formed at an inside of the first TG 50 having the ring shape in a plan view. Like the image sensor having the plurality of first TGs 50 shown in FIG. 1, an electric field for transferring charges from the first light sensing element 40 to the overlying first FD region 80 may be more effectively and strongly generated by the first TG 50 having the ring shape, so that the image sensor may have enhanced charge transfer characteristics.

Figure 5:
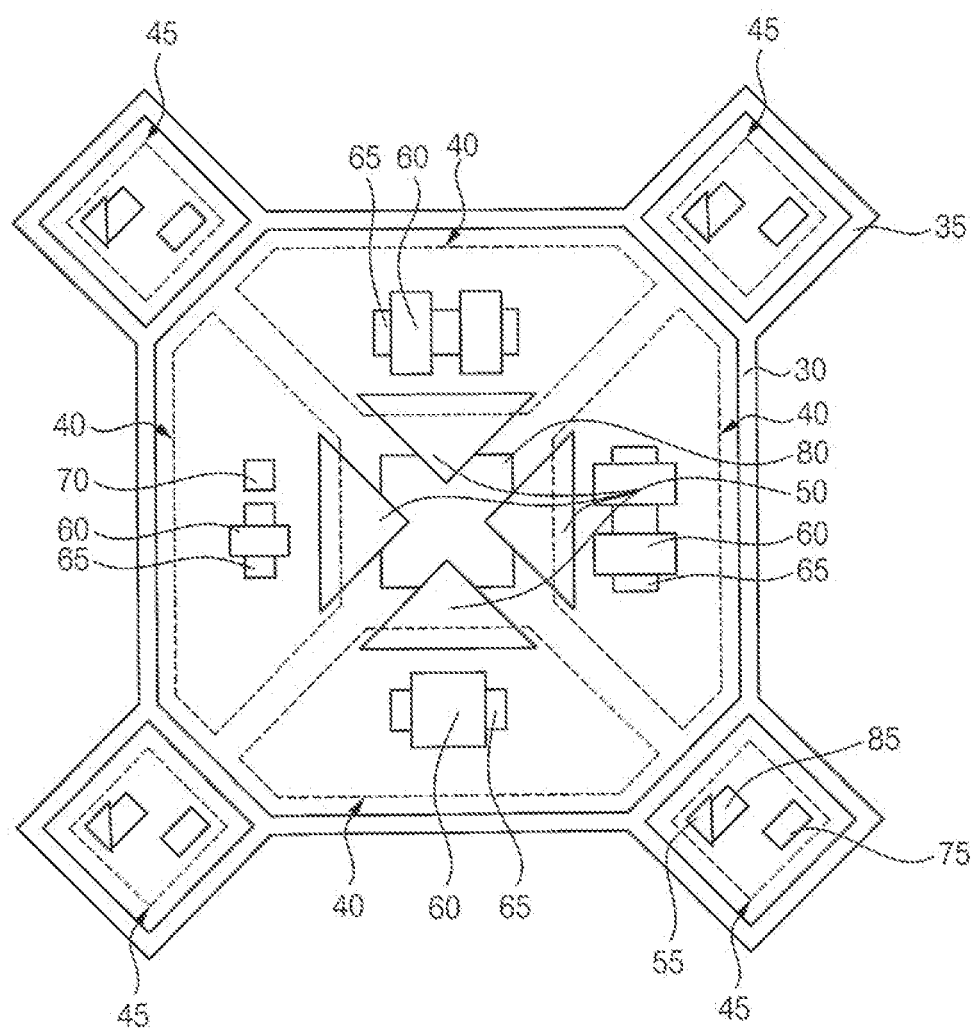

Referring to FIG. 5, the third division pattern 37 may not be formed in the main pixel region.

However, like the image sensor having the plurality of first light sensing elements 40 shown in FIG. 1, the image sensor may include a plurality of first light sensing elements 40, and a plurality of first TGs 50 may contact upper surfaces of the first light sensing elements 40, respectively.

Similar to the image sensor of FIG. 1, the first FD region 80 may be disposed between the first light sensing elements 40 in a plan view. Thus, an electric field for transferring charges from the first light sensing element 40 to the overlying first FD region 80 may be formed by the plurality of first TGs 50 so that the electric field may be efficiently and strongly generated. As a result, the image sensor may have enhanced charge transfer characteristics.

Figure 6:
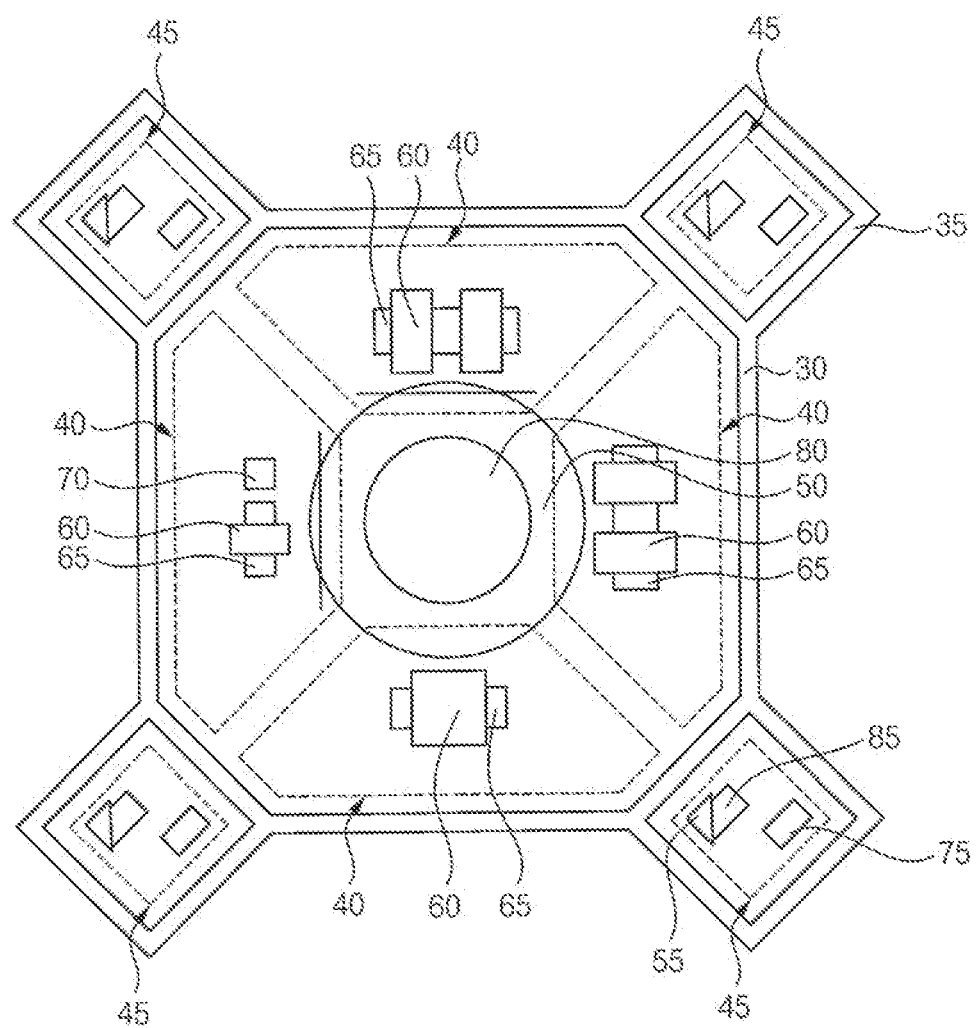

Referring to FIG. 6, like the image sensor of FIG. 4, the first TG 50 may have a shape of a circular ring in the central region of the main pixel region defined by the first division pattern 30, however, the third division pattern 37 may not be formed in the main pixel region.

Figure 7:
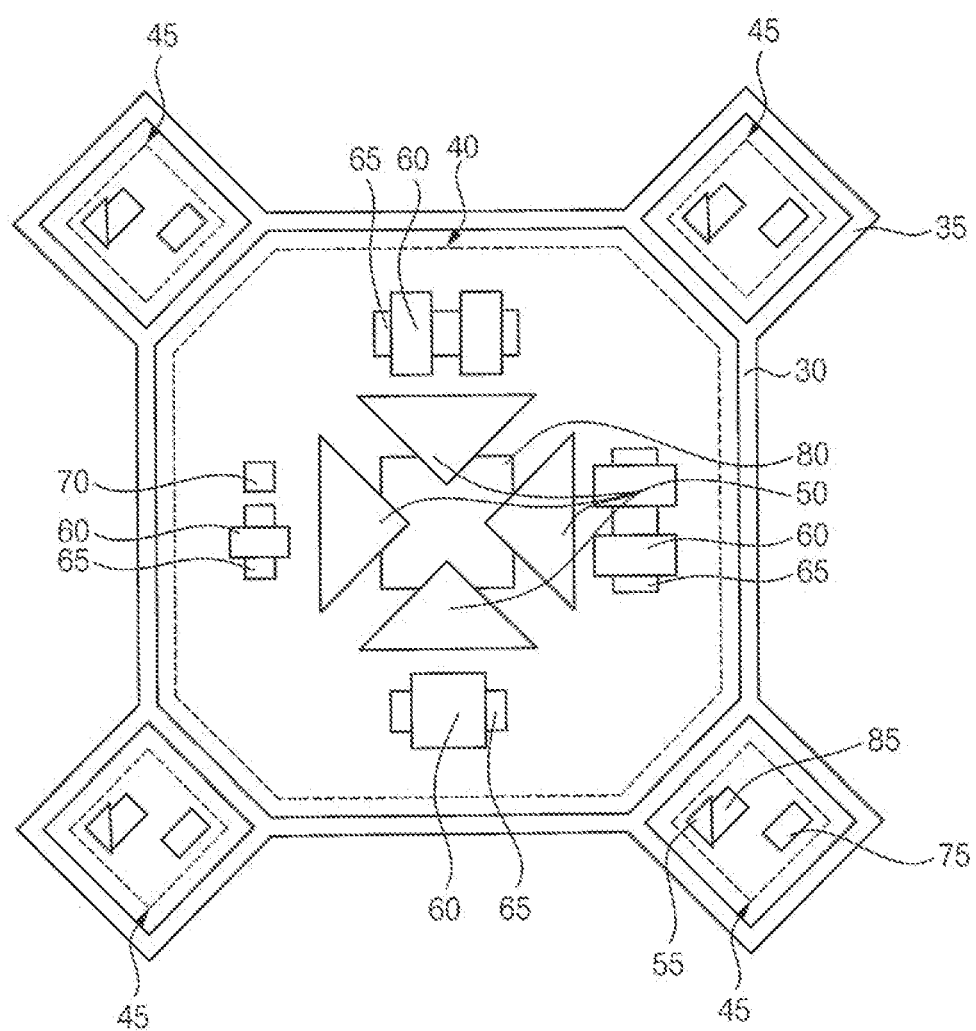

Referring to FIG. 7, only one first light sensing element 40 may be formed in the main pixel region defined by the first division pattern 30.

However, similar to the image sensor of FIG. 1, the first FD region 80 may be disposed between the first TGs 40 in a plan view, and thus the electric field may be efficiently and strongly generated and the image sensor may have enhanced charge transfer characteristics.

Figure 8:
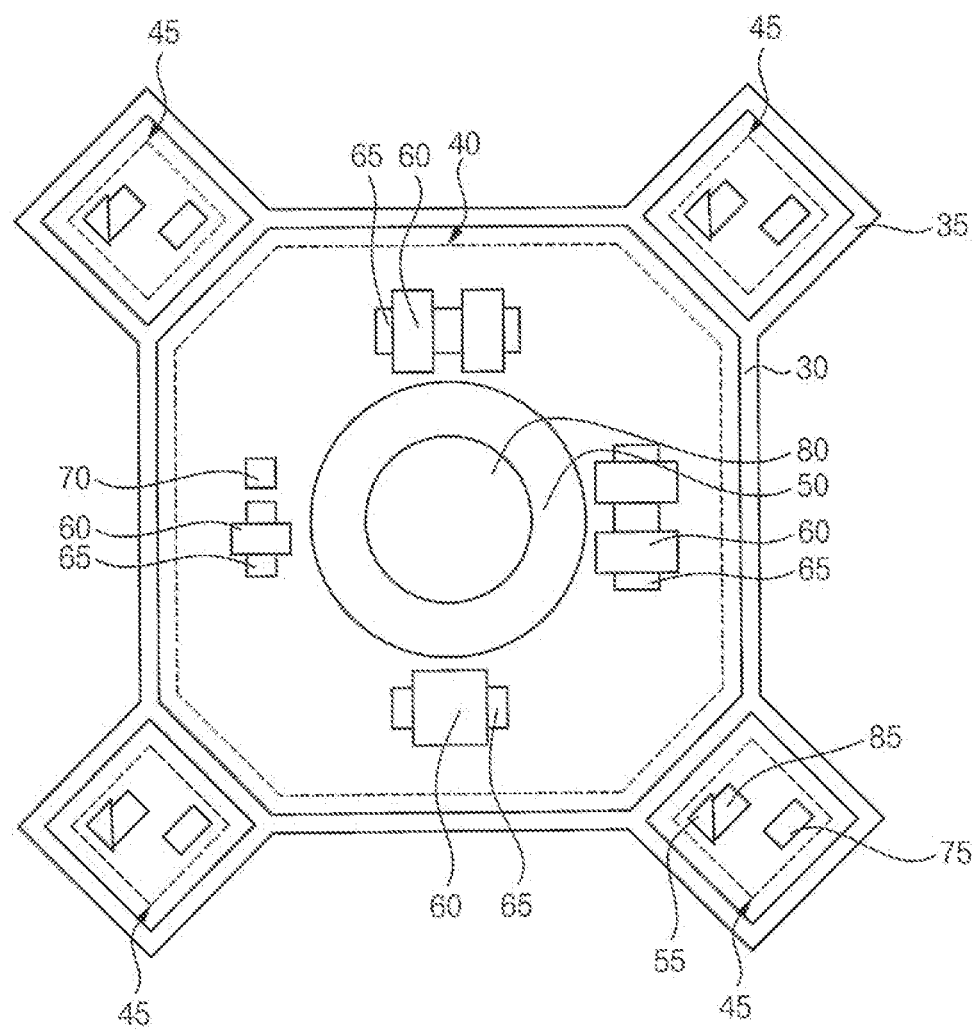

Referring to FIG. 8, only one first light sensing element 40 may be formed in the main pixel region defined by the first division pattern 30.

Similar to the image sensor of FIG. 4, the first TG 50 may have a shape of a circular ring in the central region of the main pixel region defined by the first division pattern 30. Thus, an electric field for transferring charges from the first light sensing element 40 to the overlying first FD region 80 may be more effectively and strongly generated by the first TG 50 having the ring shape, so that the image sensor may have enhanced charge transfer characteristics.

FIGS. 9 to 14 are plan views illustrating pixels included in an image sensor in accordance with example embodiments. The image sensor may be substantially the same as or similar to the image sensor illustrated with reference to FIGS. 1 and 2, apart from not having the split pixel structure but having a single pixel structure, and thus repeated explanations are omitted herein.

Figure 9:
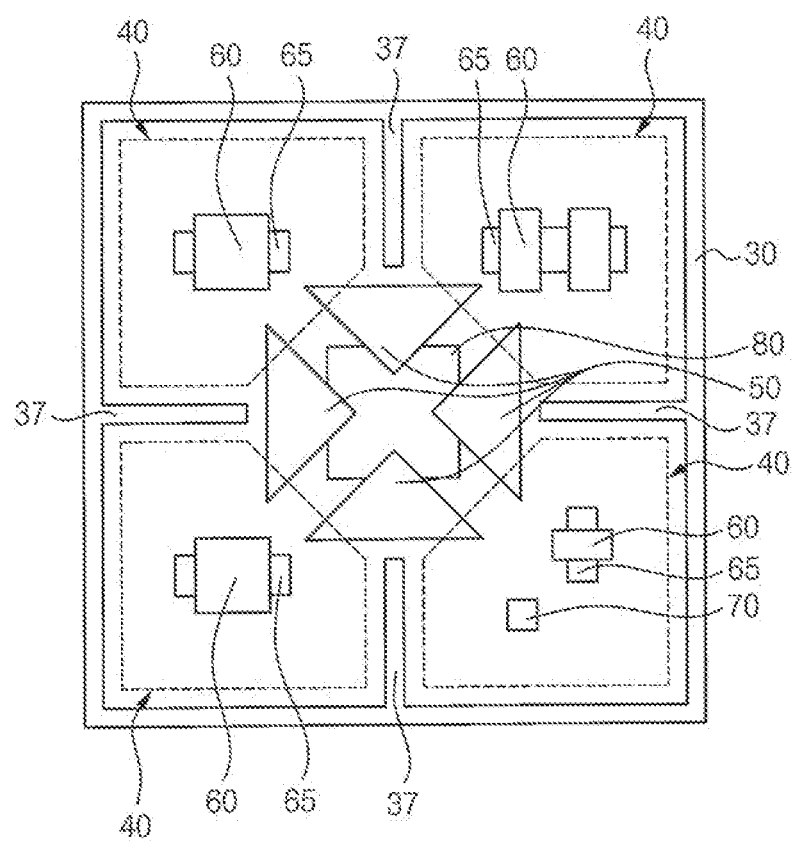
FIGS. 9, 10, 11, 12, 13, and 14 are plan views illustrating pixels included in an image sensor in accordance with example embodiments.
Figure 10:
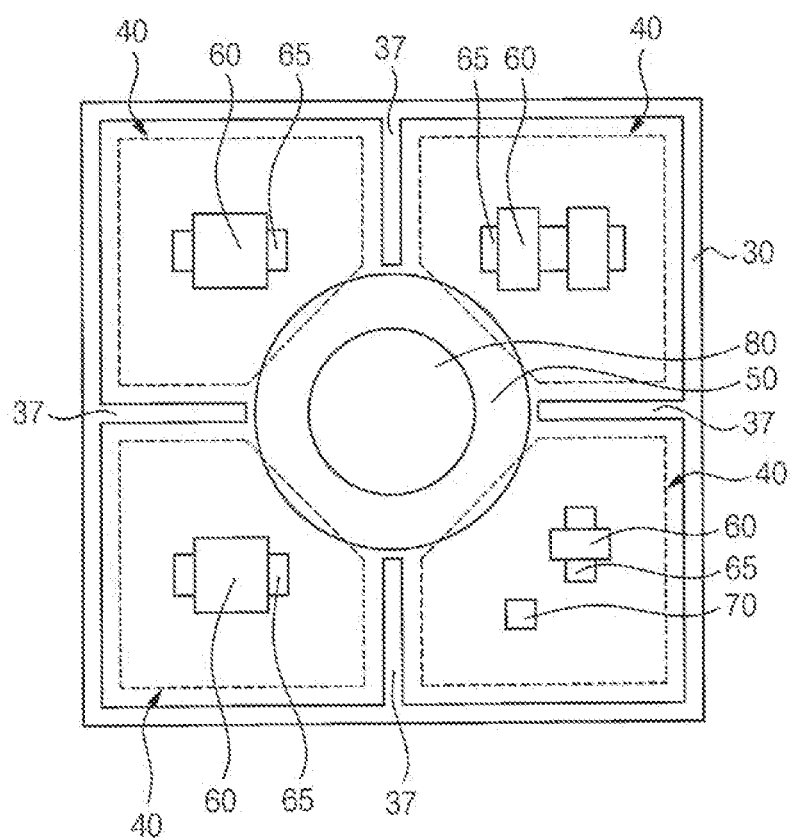
Figure 11:
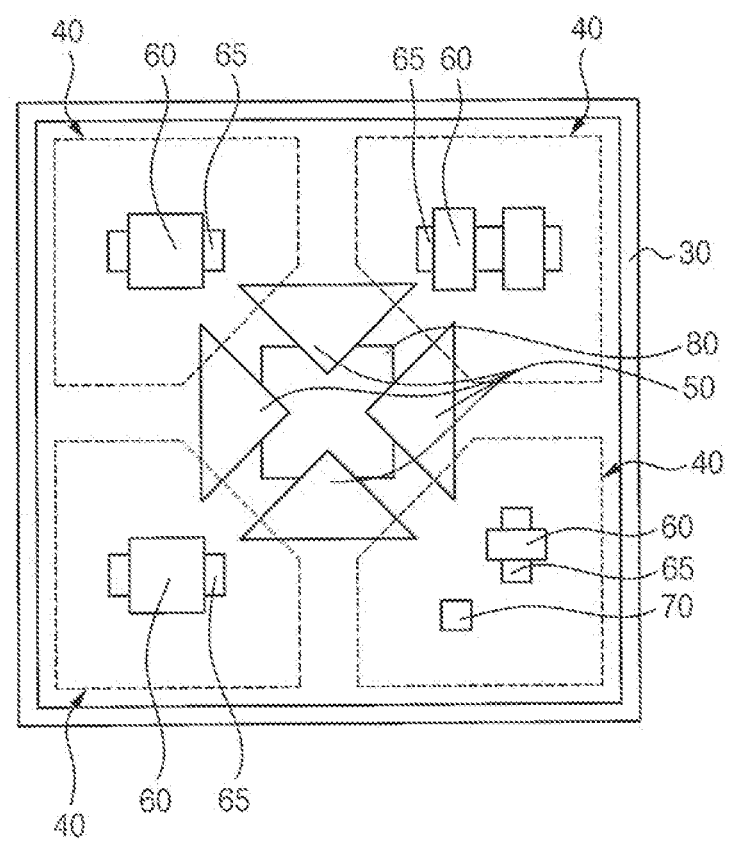
Figure 12:
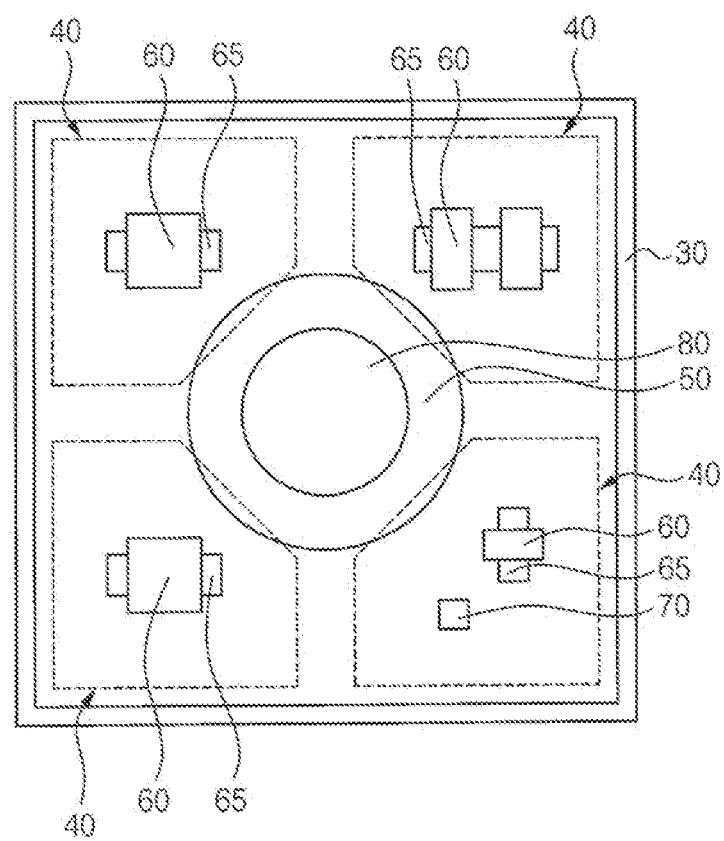
Figure 13:
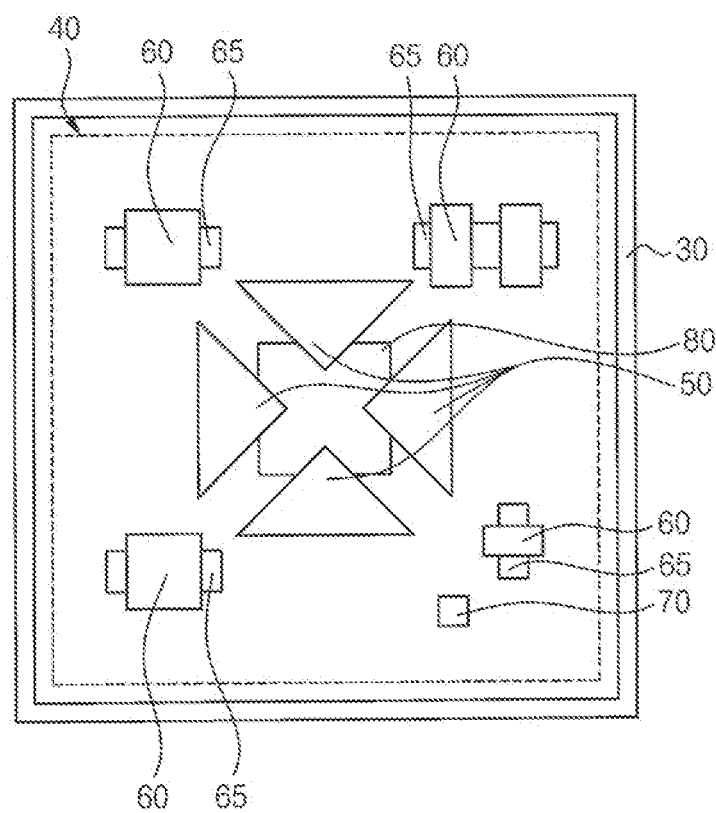
Figure 14:
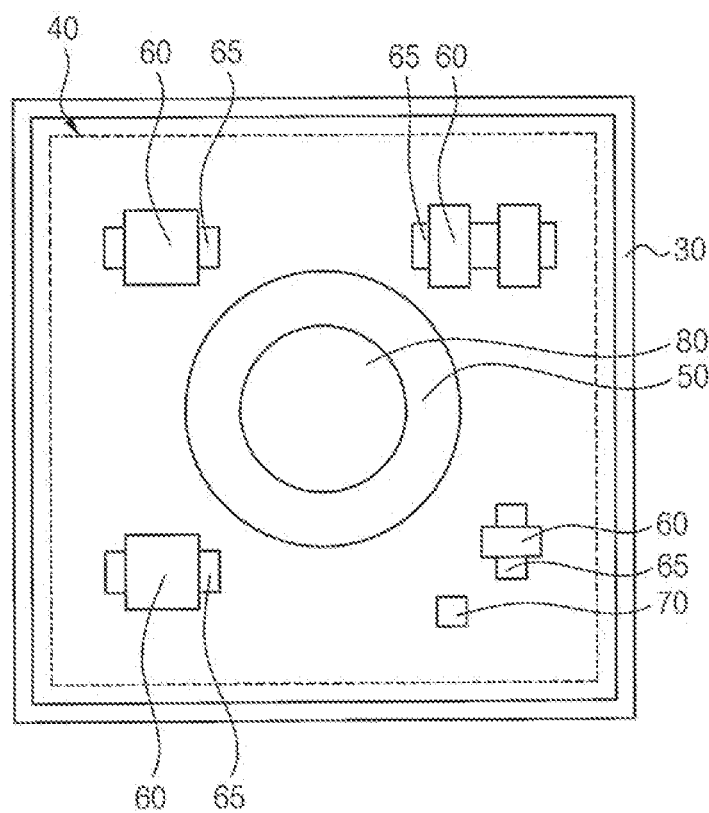

Referring to FIG. 9, all elements included in each unit pixel may be formed in the main pixel region defined by the first division pattern 30, and the second division pattern 35 may not be formed such that an additional sub pixel region may not be defined.

However, the main pixel region may be divided into the central region and the edge regions by the third division pattern 37, and a plurality of light sensing elements 40 may be formed in the edge regions, respectively. Additionally, a plurality of first TGs 50 may be formed in the central region and may partially contact the first light sensing elements 40.

In a plan view, the first FD region 80 may be formed between the plurality of first FDs 50.

Thus, an electric field for transferring charges from the first light sensing element 40 to the overlying first FD region 80 may be more effectively and strongly generated by the plurality of first TGs 50, so that the image sensor may have enhanced charge transfer characteristics.

Pixels of the image sensor shown in FIGS. 10 to 14 may correspond to the pixels of FIGS. 4 to 8, respectively, except for not including the sub pixel region, and thus repeated explanations are omitted herein.

Figure 15:
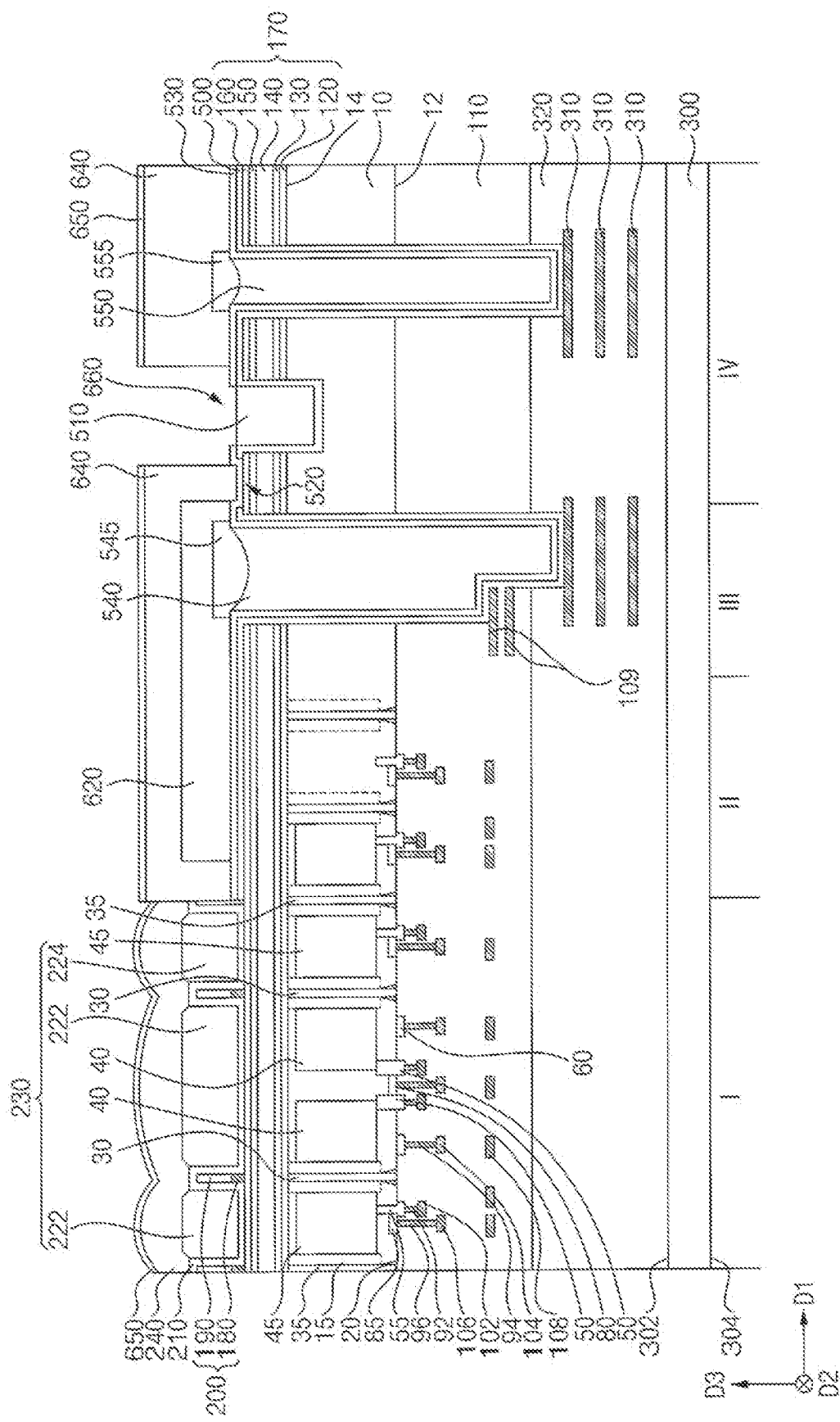
FIG. 15 is a cross-sectional view illustrating an image sensor in accordance with example embodiments.

FIG. 15 is a cross-sectional view illustrating an image sensor in accordance with example embodiments. This image sensor may include one of the pixels shown in FIGS. 1 to 14, except that the vertical direction is opposite, and thus repeated explanations are omitted herein.

Hereinafter, two directions substantially parallel to the first surface 12 of the first substrate 10 and substantially perpendicular to each other may be referred to as a first direction D1 and a second direction D2, respectively, and a direction substantially perpendicular to the first surface 12 of the first substrate 10 may be referred to as a third direction D3. In example embodiments, the first direction D1 and the second direction D2 may be substantially perpendicular to each other.

Referring to FIG. 15, the image sensor may include a second substrate 300, a second insulating interlayer 320, the first insulating interlayer 110, the first substrate 10 and the first planarization layer 170 that are sequentially stacked.

The color filter array layer 230, the microlens 240, and a transparent protection layer 650 may be sequentially stacked on the first planarization layer 170 in a first region I. A light blocking layer 620, a second planarization layer 640, and the transparent protection layer 650 may be sequentially stacked on the first planarization layer 170 in the second region II and the third region III. The second planarization layer 640 and the transparent protection layer 650 may be sequentially stacked on the first planarization layer 170 in a fourth region IV. The first planarization layer 170 and the second planarization layer 640 may be referred to as a lower planarization layer and an upper planarization layer, respectively.

The image sensor may further include a first wiring 102, a second wiring 104, a third wiring 106, and a fourth wiring 108 and the first via 92, the second via 94, and the third via 96 contained in the first insulating interlayer 110. The first division pattern 30, the second division pattern 35, and the third division pattern 37 (refer to FIG. 1) may extend through the first substrate 10 in the third direction D3, and the first light sensing element 40 and the second light sensing element 45, the first TG 50 and the second TG 55, and the first FD region 80 and second FD region 85 in the first substrate 10 in the first region I and the second region II.

The image sensor may further include the interference blocking structure 200 disposed between the color filters 222 and 224 included in the color filter array layer 230, and the protection layer 210 disposed on the first planarization layer 170 and covering a surface of the interference blocking structure 200 in the first region I.

The image sensor may further include a fifth wiring 109 contained in the first insulating interlayer 110, a sixth wiring 310 contained in the second insulating interlayer 320, and a first through via structure extending through the first planarization layer 170, the first substrate 10, the first insulating interlayer 110, and an upper portion of the second insulating interlayer 320 to commonly contact the fifth wiring 109 and the sixth wiring 310 in the third region III.

The image sensor may further include the sixth wiring 310 contained in the second insulating interlayer 320, a pad 510 extending through the first planarization layer 170 and an upper portion of the first substrate 10, a second through via structure extending through the first planarization layer 170, the first substrate 10, the first insulating interlayer 110 and an upper portion of the second insulating interlayer 320 to contact the sixth wiring 310 in the fourth region IV.

Figure 21:
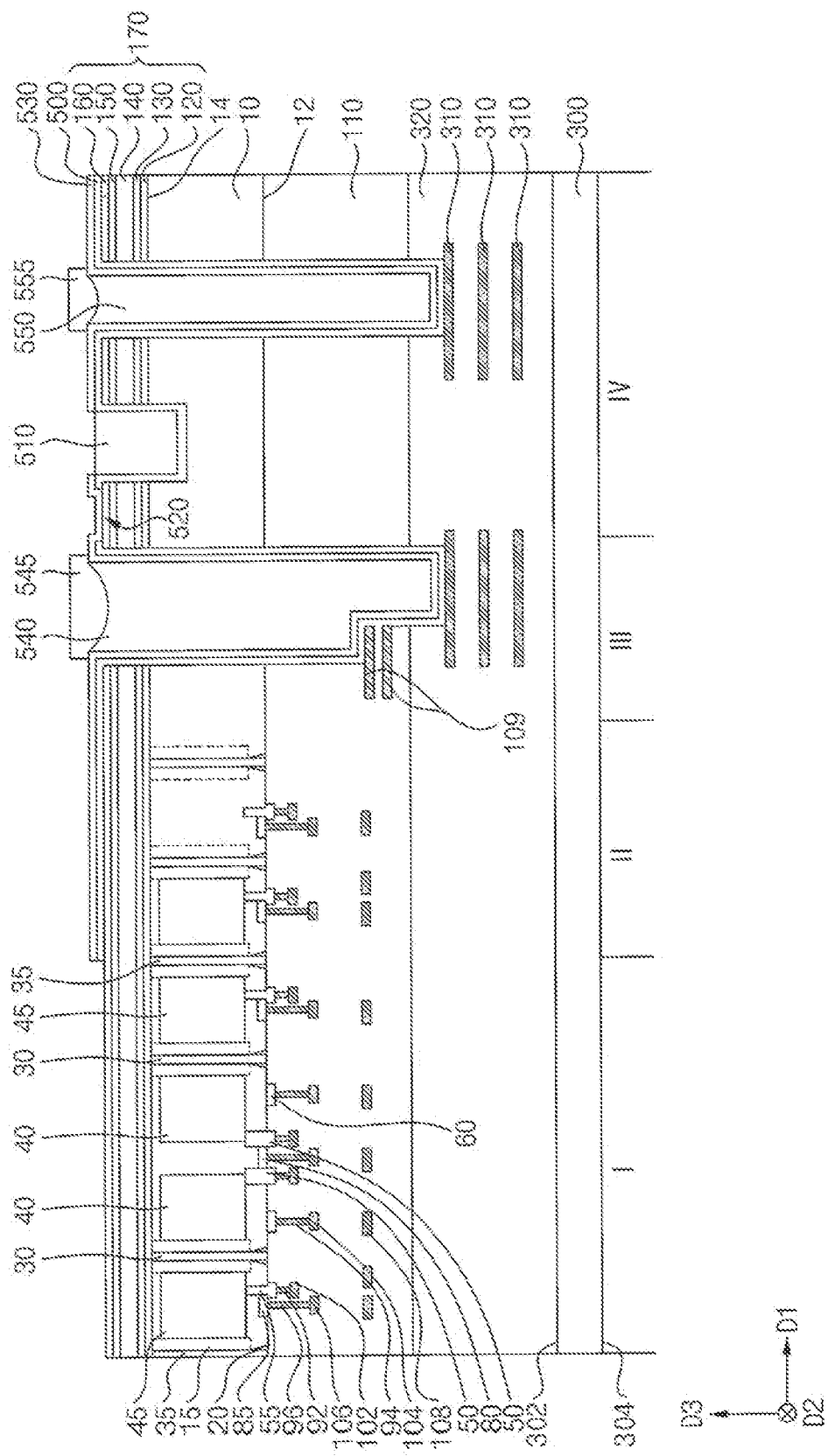

The image sensor may further include the first to third transistors at a lower portion of the first substrate 10 adjacent to the first surface 12 of the first substrate 10. The first to third transistors may include a source follower transistor, a reset transistor and a select transistor, respectively. FIG. 21 shows the gate 60 included in each of the first to third transistors is formed under the lower surface of the first substrate 10, and each of the first to third transistors may include a source/drain region 65 (refer to FIG. 1).

The first TG 50, the first FD region 80 and the first light sensing element 40 may form a first transfer transistor, and the second TG 55, the second FD region 85 and the second light sensing element 45 may form a second transfer transistor. For example, the first light sensing element 40 and the second light sensing element 45 may serve as source regions of the first transfer transistor and the second transfer transistor, respectively. The first FD region 80 and the second FD region 85 may serve as drain regions of the first transfer transistor and the second transfer transistor, respectively.

The first region I, the second region II, the third region III, and the fourth region IV may refer not only an inside of the first substrate 10 or the second substrate 300 but also spaces over and under the first substrate 10 and the second substrate 300. In example embodiments, in a plan view, the first region I may have a shape of a rectangle, the second region II may surround the first region I, the fourth region IV may surround the second region II, and the third region III may be disposed in the fourth region IV. However, embodiments are not limited thereto.

In example embodiments, the first region I may be an active pixel region in which active pixels are formed, the second region II may b an optical black (OB) region in which OB pixels are formed, the third region III may be a stack region in which the first through via structure is formed, and the fourth region IV may be a pad region in which the pads 510 are formed.

The first substrate 10 may include the first surface 12 and a second surface 14 opposite the first surface 12 in the third direction D3, and the second substrate 300 may include a third region 302 and a fourth region 304 opposite the third region 302 in the third direction D3. FIG. 21 shows the first surface 12 is under the second surface 14, and the third region 302 is over the fourth surface 304.

In example embodiments, p-type impurities may be doped into the first substrate 10 partially or entirely to form a p-type well therein.

Each of the first division pattern 30, the second division pattern 35, and the third division pattern 37 may extend through the first substrate 10 in the third direction D3 in the first region I and the second region II of the first substrate 10. In example embodiments, each of the first division pattern 30, the second division pattern 35, and the third division pattern 37 may include a core extending in the third direction D3 and a shell covering a sidewall and a lower surface of the core (refer to FIG. 1). A cover layer may be further formed to cover an upper surface of the core.

The highly doped impurity region 15 may be formed at a portion of the first substrate 10 adjacent to each of the first division pattern 30, the second division pattern 35, and the third division pattern 37.

In example embodiments, each of the first light sensing element 40 and the second light sensing element 45 may be an n-type impurity region in the p-type well in the first region I and the second region II of the first substrate 10, and thus each of the first light sensing element 40 and the second light sensing element 45 and the p-type well may form a PN junction diode. Further, each of the first light sensing element 40 and the second light sensing element 45 together with the highly doped impurity region 15 may form the PN junction diode.

In example embodiments, a plurality of first light sensing elements 40 may be spaced apart from each other between the first division patterns 30, and one second light sensing element 45 may be formed between the first division pattern 30 and the second division pattern 35.

The first light sensing element 40 and the second light sensing element 45 may be formed in each unit pixel region defined by the first division pattern 30 and the second division pattern 35 in the first region I and the second region II of the first substrate 10. However, may not be formed one or more unit pixel regions defined by the first division pattern 30 and the second division pattern 35 in the second region II of the first substrate 10.

The first TG 50 and the second TG 55 extend in the third direction D3 upwardly from the lower surface of the first substrate 10 to contact lower surfaces of the first light sensing element 40 and the second light sensing element 45, respectively. In example embodiments, each of the first TGs 50 and the second TGs 55 may include a buried portion buried in a lower portion of the first substrate 10 and a protruding portion beneath the buried portion and having a lower surface lower than the lower surface of the first substrate 10.

In example embodiments, a plurality of first TGs 50 may be spaced apart from each other between the first division patterns 30, and each of the first TGs 50 may contact a lower surface of at least one of the first division pattern 30 and the second division pattern 35. One second TG 55 may be formed between the first division pattern 30 and the second division pattern 35 to contact a lower surface of the second light sensing element 45.

The first FD region 80 and the second FD region 85 may be formed at portions of the first substrate 10 adjacent to the lower surface thereof and adjacent to the first TGs 50 and the second TGs 55, respectively, and may be an n-type doped impurity region. In example embodiments, the first FD region 80 may be disposed between the first TGs 80 in a plan view, and the second FD region 85 may be disposed at a side of the second TG 55.

The first via 92 may contact each of the first TGs 50 and the second TGs 55, and may be connected to the first wiring 102. The second via 94 may contact the gate 60, and may be connected to the second wiring 104. The third via 96 may contact each of the first FD region 80 and the second FD region 85, and may be connected to the third wiring 106. The fourth wiring 108 may be formed under the third wiring 106, and the fifth wiring 109 may be formed at the same level as and a lower level than the fourth wiring 108.

Vias and wirings connected to the first to third transistors may be further formed in the first insulating interlayer 110 in the first region I and the second region II. FIG. 15 shows the fifth wiring 109 and the sixth wiring 310 are formed at two and three levels, respectively, in the third direction D3. However, embodiments are not limited thereto.

Each of the first insulating interlayer 110 and the second insulating interlayer 320 may include an oxide, e.g., silicon oxide, or a low-k dielectric material.

In an example embodiment, the first planarization layer 170 may include a third layer 120, a fourth layer 130, a fifth layer 140, a sixth layer 150, and a seventh layer 160 sequentially stacked in the third direction D3. For example, the third layer 120, the fourth layer 130, the fifth layer 140, the sixth layer 150, and the seventh layer 160 may include aluminum oxide, hafnium oxide, silicon oxide, silicon nitride and hafnium oxide, respectively.

The interference blocking structure 200 may overlap the first division pattern 30 and the second division pattern 35 in the third direction D3. In example embodiments, the interference blocking structure 200 may include first interference blocking pattern 180 and the second interference blocking pattern 190 stacked in the third direction D3. According to another example embodiment, the interference blocking structure 200 may have a single layer structure including a transparent material having a low refractive index.

The protection layer 210 may include a metal oxide, e.g., aluminum oxide. The color filter array layer 230 may be formed on the protection layer 210, and thus a lower surface and a sidewall of each of the first color filter 222, the second color filter 224 and the third color filter included in the color filter array layer 230 may be covered by the protection layer 210. Each of the first color filter 222, the second color filter 224 and the third color filter may be a film by depositing a composition that may be formed by mixing a pigment, a pigment dispersant, a binder resin and a solvent.

The light blocking layer 620 may include the same composition as the second color filter 224, which may absorb a light having a relatively large wavelength among the first color filter 222 and the second color filter 224 and the third color filter.

The light blocking layer 620 may be formed on the first planarization layer 170, the first through via structure and an insulation pattern 530 in the second region II and the third region III of the first substrate 10, however, may not be formed on a portion of the insulation pattern 530 on a fourth trench 520, which may be formed by partially removing a portion of a conductive pattern 500 on the first planarization layer 170 at a boundary of the third region III and the fourth region IV to expose an upper surface of the first planarization layer 170.

The first through via structure may include a first filling pattern 540 extending in the third direction D3 through the first planarization layer 170, the first substrate 10, the first insulating interlayer 110 and an upper portion of the second insulating interlayer 320, the insulation pattern 530 covering a lower surface and a sidewall of the first filling pattern 540, the conductive pattern 500 covering a lower surface and a sidewall of the insulation pattern 530, and a first capping pattern 545 on an upper surface of the first filling pattern 540.

The second through via structure may include a second filling pattern 550 extending in the third direction D3 through the first planarization layer 170, the first substrate 10, the first insulating interlayer 110 and an upper portion of the second insulating interlayer 320, the insulation pattern 530 covering a lower surface and a sidewall of the second filling pattern 550, the conductive pattern 500 covering a lower surface and a sidewall of the insulation pattern 530, and a second capping pattern 555 on an upper surface of the second filling pattern 550.

Each of the first filling pattern 540 and the second filling pattern 550 may include, e.g., a low refractive index material (LRIM), and each of the first capping pattern 545 and the second capping pattern 555 may include, e.g., a photoresist material.

A portion of the conductive pattern 500 included in the first through via structure may commonly contact the fifth wiring 109 and the sixth wiring 310 so that the fifth wiring 109 and the sixth wiring 310 may be electrically connected with each other, and a portion of the conductive pattern 500 included in the second through via structure may contact the sixth wiring 310 so as to be electrically connected thereto. The conductive pattern 500 may be included in the first and second through via structures, and may also be formed on the first planarization layer 170 in the second region II, the third region III, and the fourth region IV.

The conductive pattern 500 may include a metal, e.g., tungsten. In an example embodiment, a barrier pattern including a metal nitride, e.g., titanium nitride may be further formed under the conductive pattern 500.

The insulation pattern 530 may be included in the first and second through via structures, and may also be formed on the portion of the conductive pattern 500 on the first planarization layer 170 in the second region II, the third region III, and the fourth region IV. As illustrated above, the insulation pattern 530 may also be formed on the fourth trench 520 exposing the upper surface of the first planarization layer 170 to partially contact the first planarization layer 170. The insulation pattern 530 may include an oxide, e.g., silicon oxide.

The pad 510 may be electrically connected with an outer wiring, and may be a path through which electrical signals may be input into the active pixels and/or the OB pixels, or electrical signals may be output from the active pixels and/or the OB pixels. The pad 510 may include a metal, e.g., aluminum. A lower surface and a sidewall of the pad 510 may be covered by the conductive pattern 500.

The microlens 240 may be formed on the color filter array layer 230 and the protection layer 210 in the first region I, and the second planarization layer 640 may be formed on the light blocking layer 620, the insulation pattern 530 and the second through via structure in the second region II, the third region III, and the fourth region IV. However, the second planarization layer 640 may include a third opening 660 exposing an upper surface of the pad 510 in the fourth region IV. In example embodiments, the microlens 240 and the second planarization layer 640 may include substantially the same material, e.g., a photoresist material having a high transmittance.

The transparent protection layer 650 may be formed on the microlens 240 and the second planarization layer 640. The transparent protection layer 650 may include, e.g., silicon oxide (SiO), silicon oxycarbide (SiOC), silicon carbide (SiC), silicon carbon-nitride (SiCN), etc.

In the image sensor in accordance with example embodiments, the third division pattern 37 may be further formed in the main pixel region defined by the first division pattern 30 to divide the main pixel region into the central region and edge regions, and the first light sensing element 40 may be formed in each of the edge regions to have an area similar to or not much larger than that of the second light sensing element 45 in the sub pixel region defined by the first division pattern 30 and the second division pattern 35, so that the first light sensing element 40 and the second light sensing element 45 may have optimized doping concentrations even with the same doping process. Additionally, the highly doped impurity region 15 including p-type impurities may be formed at a portion of the first substrate 10 adjacent to not only the first division pattern 30 and the second division pattern 35 but also the third division pattern 37, so that the first light sensing element 40 and the highly doped impurity region 15 may form a PN junction diode having enhanced characteristics.

Further, a plurality of first TGs 50 may be spaced apart from each other on the first light sensing elements 40 in the main pixel region, and the first FD region 80 may be disposed between the plurality of first TGs 50 in a plan view. Thus, an electric field for transferring charges from the first light sensing element 40 to the overlying first FD region 80 may be generated by the plurality of first TGs 50. Accordingly, the electric field may be efficiently and strongly generated so that the image sensor may have enhanced charge transfer characteristics.

FIGS. 16 to 22 are cross-sectional views illustrating a method of manufacturing an image sensor in accordance with example embodiments, particularly, the image sensor of FIG. 15.

Figure 16:
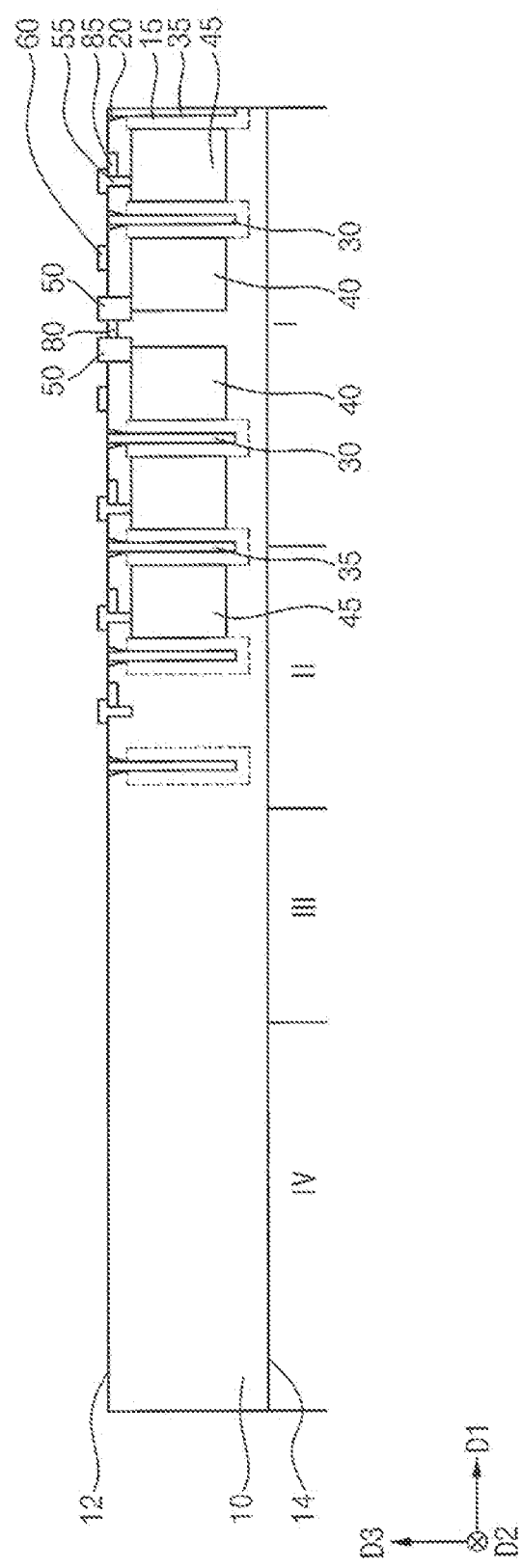
FIGS. 16, 17, 18, 19, 20, 21, and 22 are cross-sectional views illustrating a method of manufacturing an image sensor in accordance with example embodiments, particularly, the image sensor of FIG. 15.

Referring to FIG. 16, first division pattern 30, the second division pattern 35, and the third division pattern 37 (refer to FIG. 1) and the first light sensing element 40 and the second light sensing element 45 may be formed in the first substrate 10 including a first region I, a second region II, a third region III, and a fourth region IV and having a first surface 12 and a second surface 14 opposite to each other, and first TGs 50 and the second TGs 55, first to third transistors, and the first FD region 80 and the second FD region 85 may be formed.

In example embodiments, p-type impurities may be doped into a portion or an entire portion of the first substrate 10 to form a p-type well.

The first division pattern 30, the second division pattern 35, and the third division pattern 37 may fill a first trench extending in the third direction D3 from the first surface 12. For example, an upper surface thereof downwardly in the first region I and the second region II of the first substrate 10. In example embodiments, each of the first division pattern 30, the second division pattern 35, and the third division pattern 37 may be formed by forming a first layer on an inner wall of the first trench and the first surface 12 of the first substrate 10, forming a second layer on the first layer to fill a remaining portion of the first trench, and planarizing the first and second layers until the first surface 12 of the first substrate 10 is exposed. Thus, each of the first division pattern 30, the second division pattern 35, and the third division pattern 37 may be formed to include a core extending in the third direction D3 and a shell covering a sidewall and a lower surface of the core (refer to FIG. 1).

However, before forming the first division pattern 30, the second division pattern 35, and the third division pattern 37 in the first trench, p-type impurities may be highly doped into a portion of the first substrate 10 adjacent to the first trench to form a highly doped impurity region 15.

In example embodiments, the first light sensing element 40 and the second light sensing element 45 may be formed by doping n-type impurities into an inside of the p-type well in the first region I and the second region II of the first substrate 10.

In example embodiments, a plurality of first light sensing elements 40 may be formed to be spaced apart from each other between the first division patterns 30, and a second light sensing element 45 may be formed between the first and second division patterns 30 and 35.

According to another example embodiment, before forming the first division pattern 30, the second division pattern 35, and the third division pattern 37, the first light sensing element 40 and the second light sensing element 45 may be formed.

The first TGs 50 and the second TGs 55 may fill a second trench extending in the third direction D3 from the first surface 12 of the first substrate 10 downwardly. In example embodiments, each of the first TGs 50 and the second TGs 55 may include a buried portion in the second trench, and a protruding portion on the buried portion and having an upper surface higher than the first surface 12 of the first substrate 10.

When the first TGs 50 and the second TGs 55 are formed, a gate 60 of each of the first and second to third transistors may be formed on the first surface 12 of the first substrate 10.

For example, n-type impurities may be doped into a portion of the first substrate 10 adjacent to the first surface 12 and the first TGs 50 and the second TGs 55 to form first FD region 80 and the second FD region 85, respectively. A source/drain region 65 (refer to FIG. 1) of each of the first to third transistors may be formed at a portion of the first substrate 10 adjacent to the gate 60 and the first surface 12 thereof.

Figure 17:
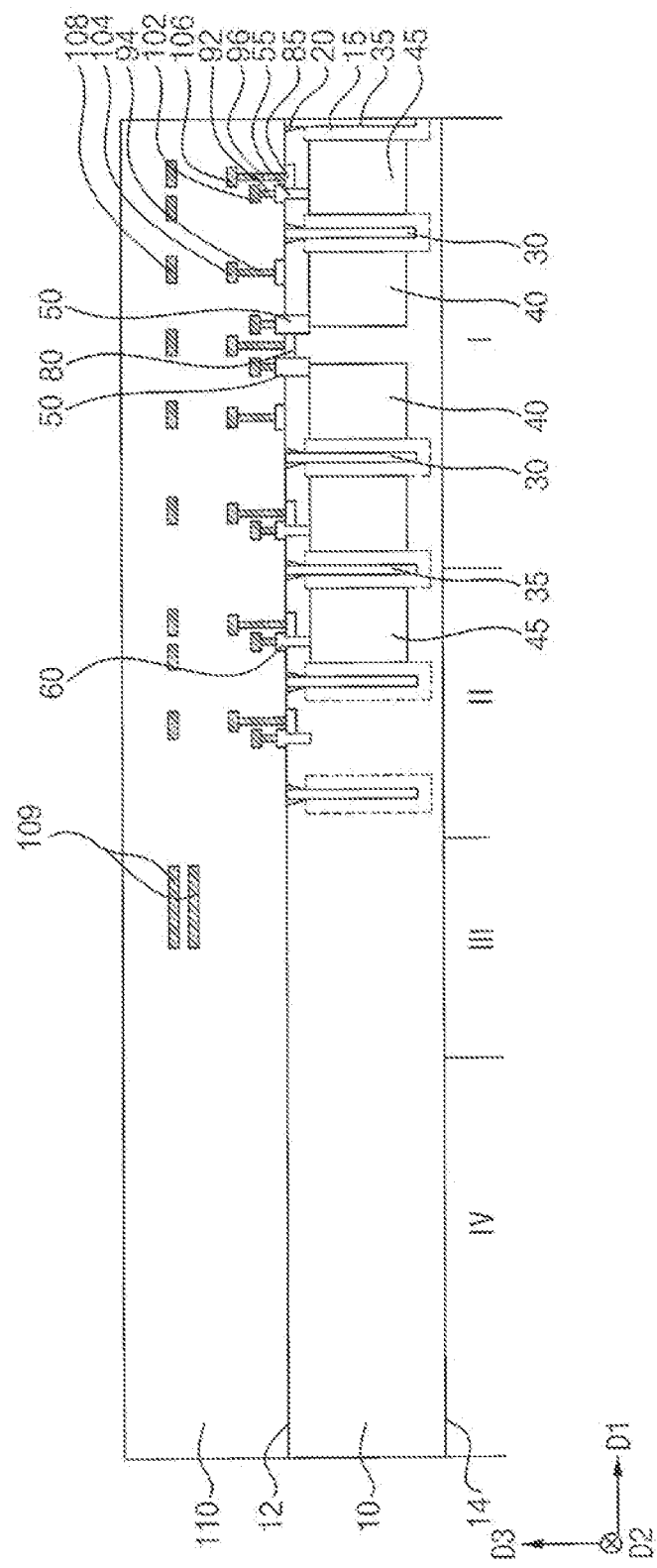

Referring to FIG. 17, a first insulating interlayer 110 containing a first via 92, a second via 94, and a third via 96 and a first wiring 102, a second wiring 104, a third wiring 106, a fourth wiring 108, and a fifth wiring 109 may be formed on the first surface 12 of the first substrate 10.

The first wiring 102, the second wiring 104, the third wiring 106, and the fourth wiring 108 may be formed in the first region I and the second region II of the first substrate 10, and the fifth wiring 109 may be formed in the third region III of the first substrate 10.

In example embodiments, the first via 92, the second via 94, and the third via 96 and the first wiring 102, the second wiring 104, the third wiring 106, the fourth wiring 108, and the fifth wiring 109 may be formed by a dual damascene process or a single damascene process.

Figure 18:
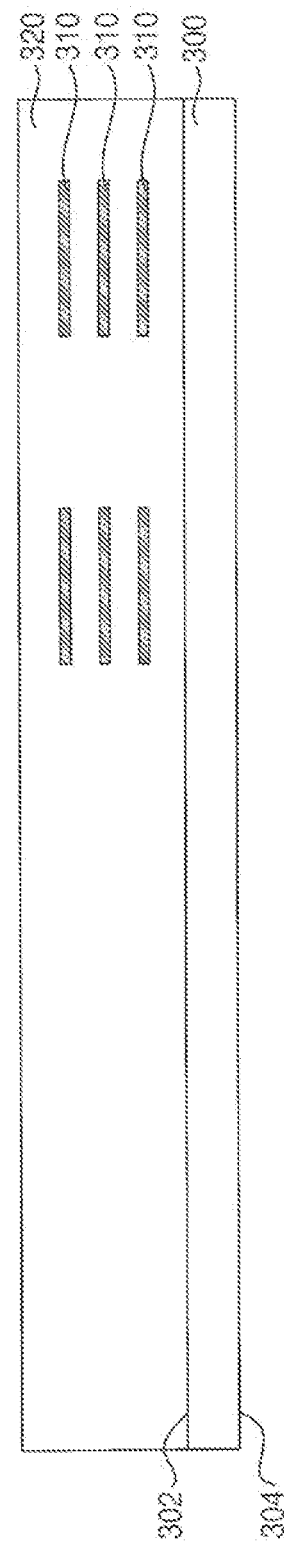

Referring to FIG. 18, a second insulating interlayer 320 containing a sixth wiring 310 may be formed on a third surface 302 of the second substrate 300 including the third surface 302 and a fourth surface 304 opposite thereto.

Figure 19:
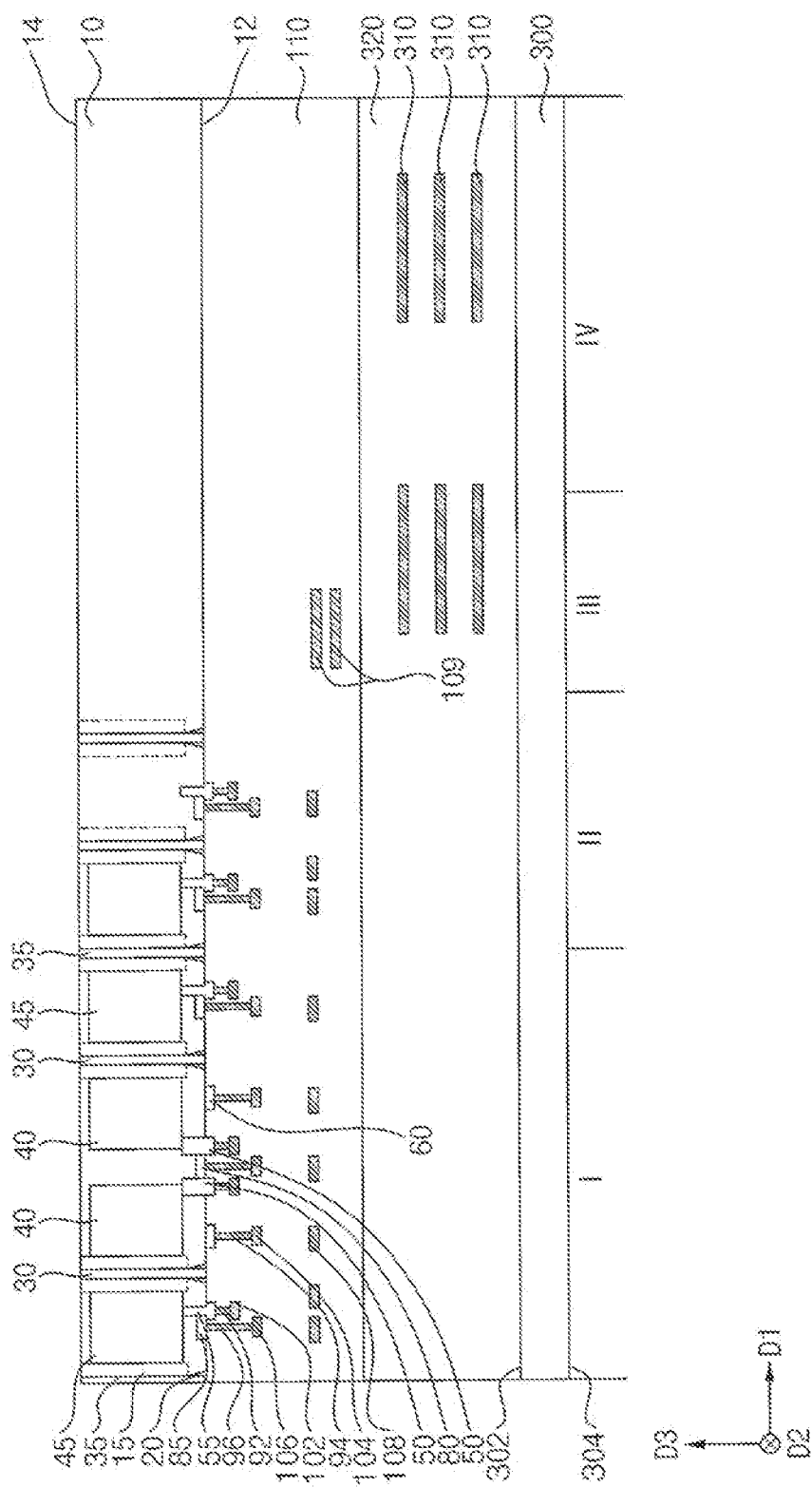

Referring to FIG. 19, the first insulating interlayer 110 on the first substrate 10 and the second insulating interlayer 320 on the second substrate 300 may be bonded with each other, and a portion of the first substrate 10 adjacent to the second surface 14 may be removed.

In example embodiments, the first insulating interlayer 110 and the second insulating interlayer 320 may be bonded through a bonding layer. According to another example embodiment, the first insulating interlayer 110 and the second insulating interlayer 320 may be bonded with no bonding layer. After bonding the first insulating interlayer 110 and the second insulating interlayer 320, the bonded structure may be overturn so that the second surface 14 of the first substrate 10 may face upward, and hereinafter, the bonded structure will be explained with the second surface 14 of the first substrate 100 facing upward.

As the first substrate 10 and the second substrate 300 are bonded with each other, the sixth wirings 310 on the second substrate 300 may be disposed in the third region III and the fourth region IV of the first substrate 10.

In example embodiments, the portion of the first substrate 10 adjacent to the second surface 14 may be removed by a polishing process, e.g., a grinding process. Thus, the first division pattern 30, the second division pattern 35, and the third division pattern 37 may be exposed, and a portion of the shell of the highly doped impurity region 15 may be removed so as to expose an upper surface of the core. A cover layer may be further formed to cover the exposed upper surface of the core of the highly doped impurity region 15.

Figure 20:
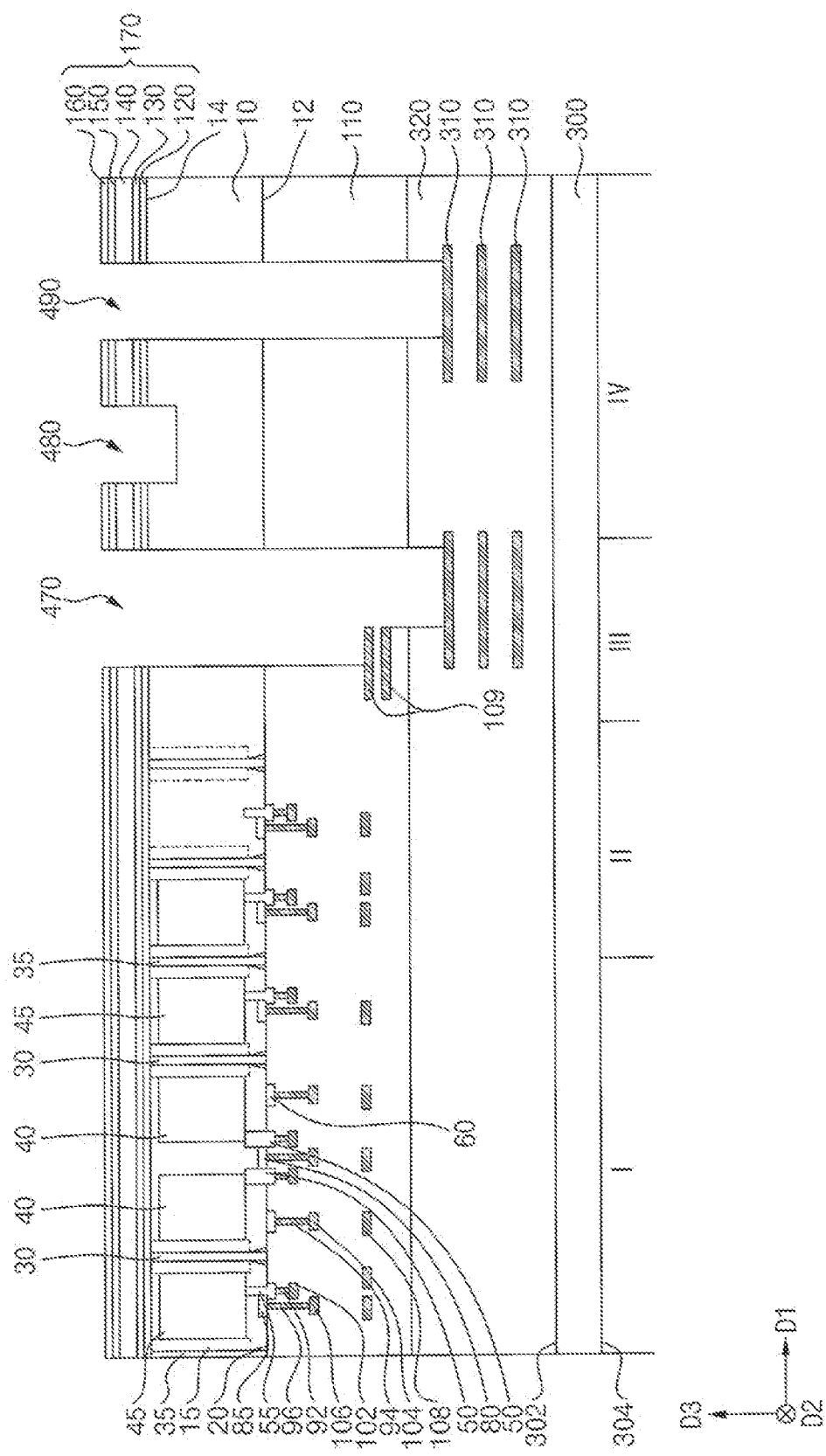

Referring to FIG. 20, a first planarization layer 170 may be formed on the second surface 14 of the first substrate 10.

In an example embodiment, the first planarization layer 170 may include a third layer 120, a fourth layer 130, a fifth layer 140, a sixth layer 150, and a seventh layer 160 sequentially stacked in the third direction D3.

The first planarization layer 170, the first substrate 10, the first insulating interlayer 110 and an upper portion of the second insulating interlayer 320 in the third region III of the first substrate 10 may be partially removed to form a first opening 470. The first planarization layer 170 and an upper portion of the first substrate 10 in the fourth region IV may be removed to form a third trench 480, and the first planarization layer 170. The first insulating interlayer 110 and an upper portion of the second insulating interlayer 320 in the fourth region IV of the first substrate 10 may be removed to form a second opening 490.

The first opening 470 may expose the fifth wiring 109 in the first insulating interlayer 110 and the sixth wiring 310 in the second insulating interlayer 320, and the second opening 490 may expose the sixth wiring 310 in the second insulating interlayer 320.

Referring to FIG. 21, a first conductive layer may be formed bottoms and sides of the first second opening 470 and the second opening 490 and the third trench 480 and an upper surface of the first planarization layer 170, a second conductive layer may be formed on the first conductive layer to fill the third trench 480, and an upper portion of the second conductive layer may be exposed until an upper surface of the first conductive layer is exposed.

Thus, a pad 510 may be formed on the first conductive layer in the third trench 480 in the fourth region IV of the first substrate 10.

The planarization process may be performed by, e.g., a chemical mechanical polishing (CMP) process and/or an etch back process.

Before forming the first conductive layer, a barrier layer may be further formed on the bottoms and sides of the first opening 470 and the second opening 490 and the third trench 480 and the upper surface of the first planarization layer 170.

The first conductive layer may be partially removed at a boundary area between the third region III and the fourth region IV of the first substrate 10 to form a fourth trench 520 exposing an upper surface of the first planarization layer 170.

An insulation layer may be formed on upper surfaces of the first conductive layer and the pad 510 and a bottom and a sidewall of the fourth trench 520, a filling layer may be formed on the insulation layer to fill the first opening 470 and the second opening 490, and an upper portion of the filling layer may be planarized until an upper surface of the insulation layer is exposed.

An additional etching process may be performed on the filling layer so that a portion of the filling layer in the fourth trench 520 may be removed, and thus a first filling pattern 540 may be formed on the insulation layer in the first opening 470 in the third region III of the first substrate 10, and a second filling pattern 550 may be formed on the insulation layer in the second opening 490 in the fourth region IV of the first substrate 10.

A capping layer may be formed on the first filling pattern 540 and the second filling pattern 550 and the insulation layer, and patterned to form a first capping pattern 545 and a second capping pattern 555 on the first filling pattern 540 and the second filling pattern 550, respectively.

A portion of the insulation layer in the first region I of the first substrate 10 and a portion of the insulation layer on the pad 510 on the upper surface of the pad 510 may be removed to form an insulation pattern 530, and a portion of the first conductive layer in the first region I of the first substrate 10 may be removed to form a conductive pattern 500. Thus, the upper surface of the first planarization layer 170 in the first region I of the first substrate 10 may be exposed.

When the barrier layer is formed under the first conductive layer, the barrier layer may also be partially removed when the portion of the first conductive layer is removed to form a barrier pattern.

A portion of the conductive pattern 500 and the insulation pattern 530 in the first opening 470, the first filling pattern 540 and the first capping pattern 545 in the third region III of the first substrate 10 may form a first through via structure. A portion of the conductive pattern 500 and the insulation pattern 530 in the second opening 490, the second filling pattern 550 and the second capping pattern 555 in the fourth region IV of the first substrate 10 may form a second through via structure.

Figure 22:
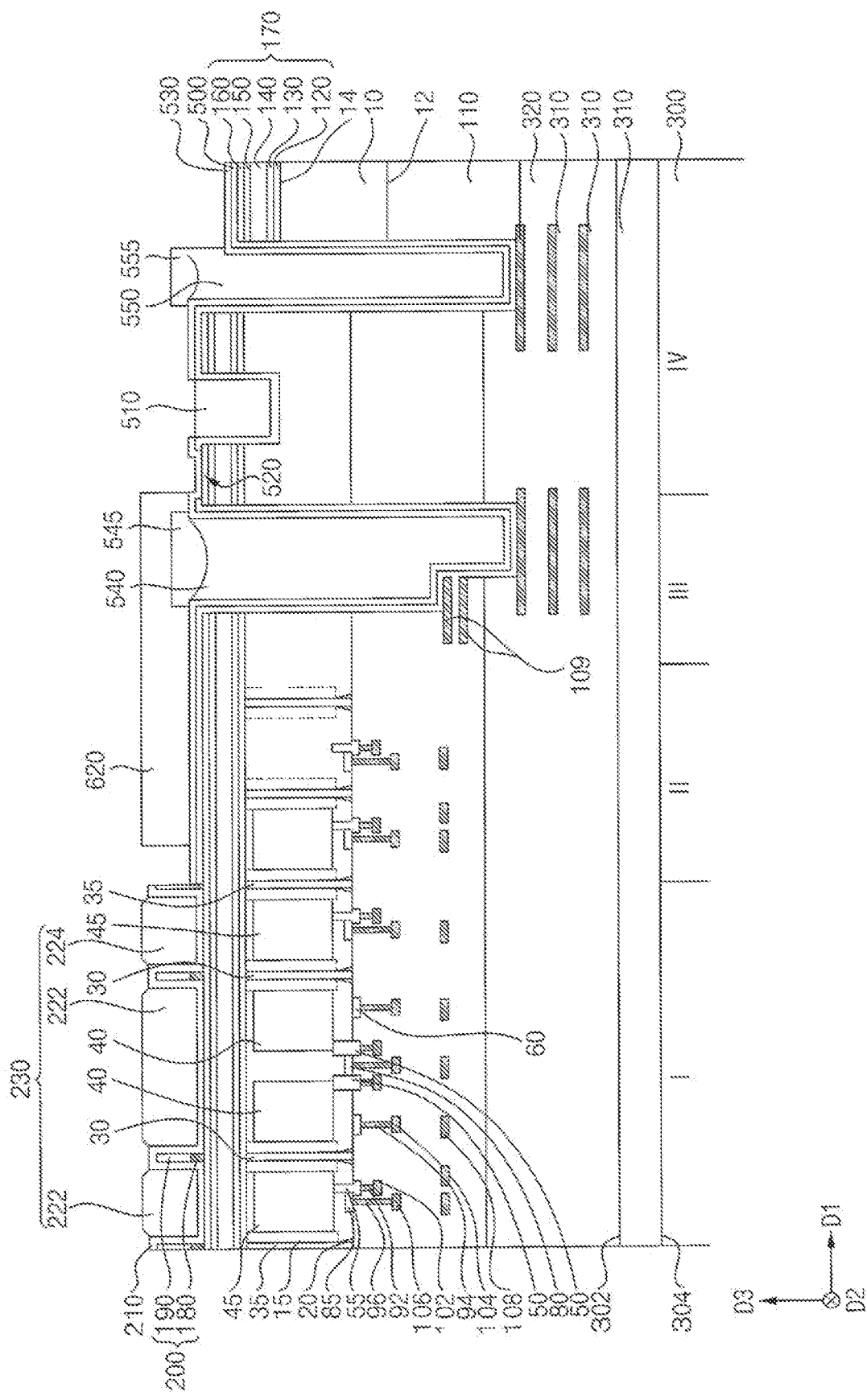

Referring to FIG. 22, an interference blocking structure 200 may be formed on the upper surface of the first planarization layer 170 in the first region I of the first substrate 10, and a protection layer 210 may be formed on the first planarization layer 170 and the interference blocking structure 200.

The interference blocking structure 200 may be formed to overlap the first division pattern 30 and the second division pattern 35 in the third direction D3.

A color filter array layer 230 may be formed on the protection layer 210 in the first region I of the first substrate 10, and a light blocking layer 620 may be formed on the insulation pattern 530 and the first capping pattern 545 in the second region II and the third region III of the first substrate 10.

In example embodiments, a first color filter 222 may be formed in a first portion of an area that may be defined by the interference blocking structure 200, a second color filter 224 may be formed in a second portion of the area, and a third color filter may be formed in a third portion of the area, so that the color filter array layer 230 may be formed. Each of the first color filter 222, the second color filter 224 and the third color filter may be formed by depositing a color filter layer and performing an exposure process and a developing process on the color filter layer.

For example, when the second color filter 224, the light blocking layer 620 including the same composition as the second color filter 224 may be formed on the first planarization layer 170, the first capping pattern 545 and the insulation pattern 530 in the second region II of the first substrate 100. The light blocking layer 620 may not be formed on a portion of the insulation pattern 530 in the fourth trench 520 (refer to FIG. 21).

Referring to FIG. 15 again, a second planarization layer 640 may be formed on the color filter array layer 230, the protection layer 210, the light blocking layer 620, the insulation pattern 530, the pad 510 and the second capping pattern 555 in the first region I, the second region II, the third region III, and the fourth region IV of the first substrate 10, and a patterning process and a reflow process may be performed on the second planarization layer 640 in the first region I of the first substrate 10 to form a microlens 240.

A transparent protection layer 650 may be formed on the microlens 240 and the second planarization layer 640, and a portion of the transparent protection layer 650 overlapping the pad 510 in the fourth region IV of the first substrate 10 and a portion of the second planarization layer 640 thereunder may be removed to form a third opening 660 exposing an upper surface of the pad 510.

An upper wiring may be further formed to be electrically connected to the pad 510 so that the fabrication of the image sensor may be completed.

Figure 23:
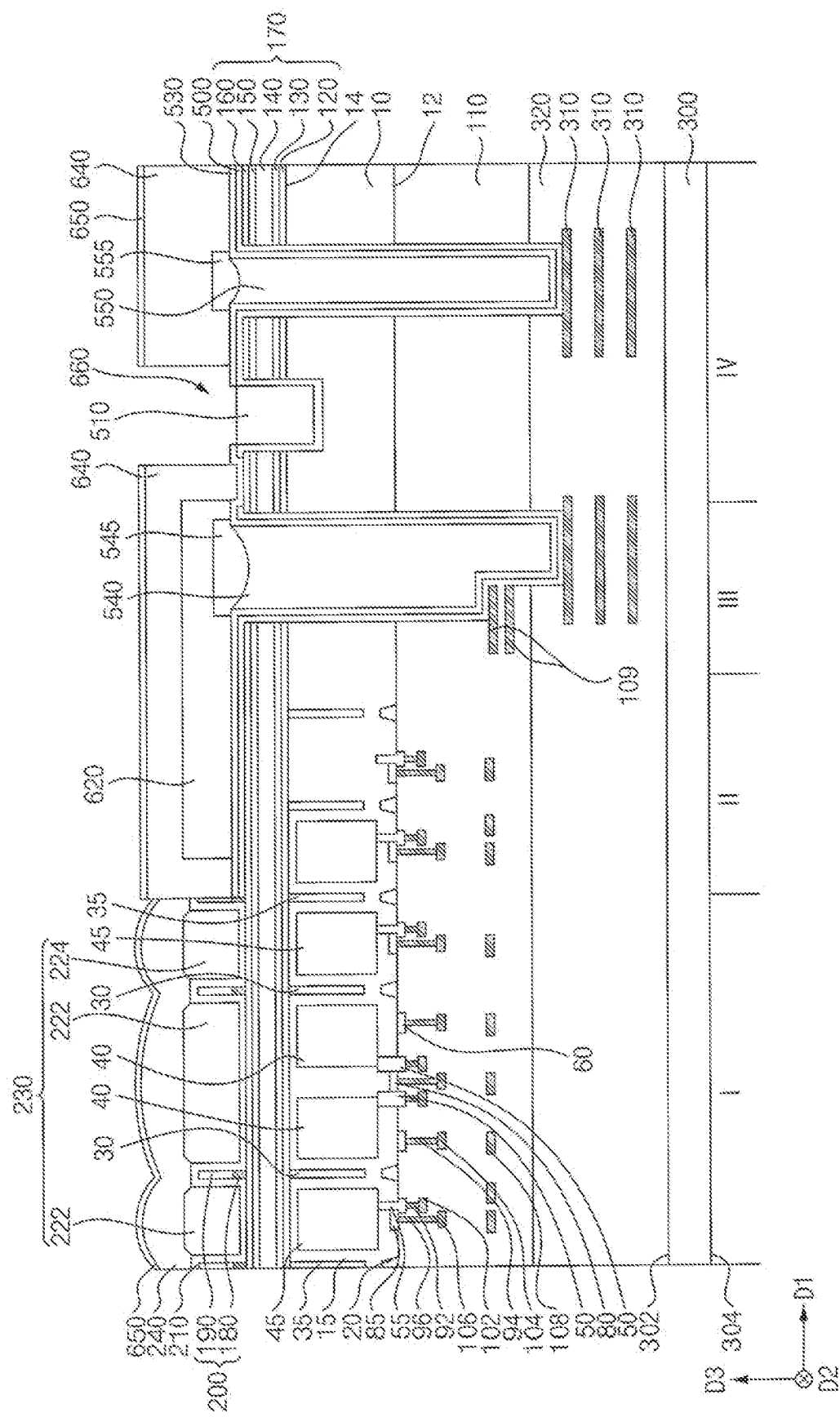
FIG. 23 is a cross-sectional view illustrating an image sensor in accordance with example embodiments.

FIG. 23 is a cross-sectional view illustrating an image sensor in accordance with example embodiments. This image sensor may be substantially the same as or similar to that of FIG. 5, except for the first division pattern 30, the second division pattern 35, and the third division pattern 37.

Referring to FIG. 23, each of the first division pattern 30, the second division pattern 35, and the third division pattern 37 may extend in the third direction D3 downwardly from the second surface 14 of the first substrate 10. However, the first division pattern 30, the second division pattern 35, and the third division pattern 37 may not entirely penetrate through the first substrate 10, but may penetrate through an upper portion and a middle portion of the first substrate 10.

The first division pattern 30, the second division pattern 35, and the third division pattern 37 shown in FIG. 23, unlike the first division pattern 30, the second division pattern 35, and the third division pattern 37 shown in FIG. 15, may not be formed during the processes illustrated with reference to FIG. 16. The first division pattern 30, the second division pattern 35, and the third division pattern 37 may be formed by bonding the first substrate 10 and second substrate 300 illustrated with reference to FIG. 19, removing a portion of the first substrate 10 near the second surface 14, forming a fifth trench extending downwardly in the third direction D3 through the first substrate 10 from the second surface 14, and filling a material into the fifth trench. The fifth trench may not extend to the first surface 12 of the first substrate 10, and thus each of the first division pattern 30, the second division pattern 35, and the third division pattern 37 may not entirely extend through the first substrate 10, but may extend through a portion of the first substrate 10.

Figure 24:
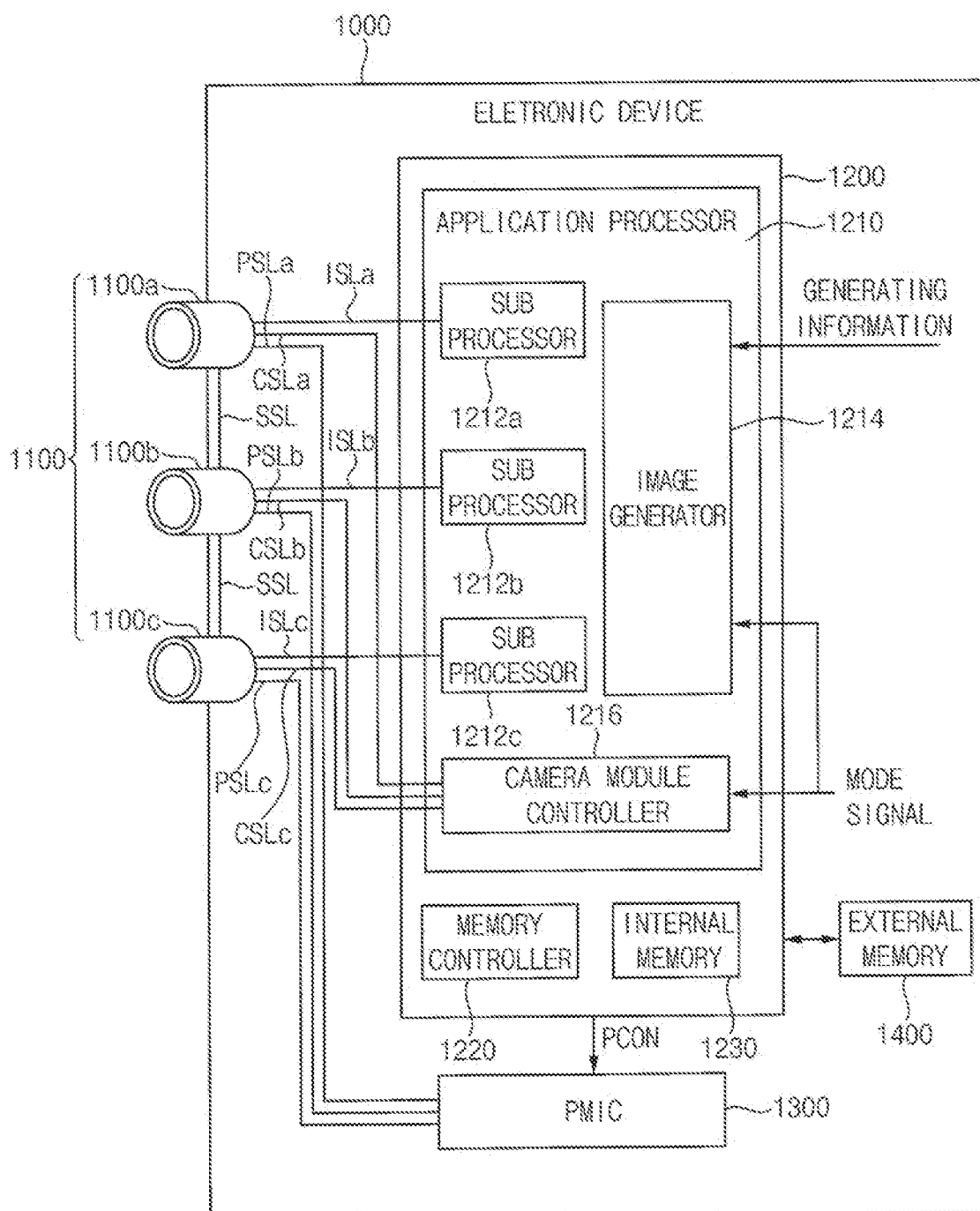
FIG. 24 is a block diagram illustrating an electronic device including an image sensor in accordance with example embodiments.
Figure 25:
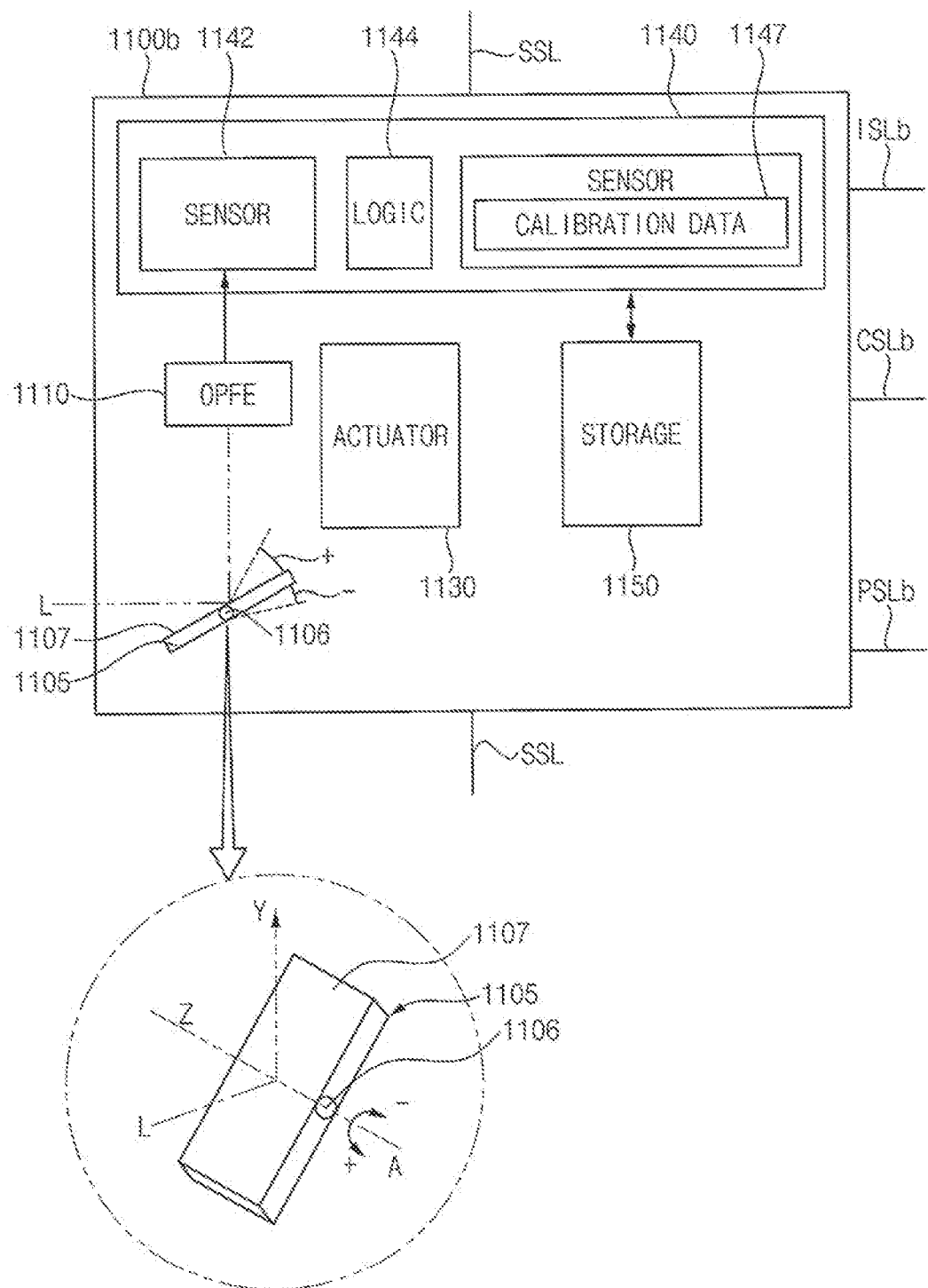
FIG. 25 is a block diagram illustrating a camera device included in the electronic device of FIG. 24.

FIG. 24 is a block diagram illustrating an electronic device including an image sensor in accordance with example embodiments, and FIG. 25 is a block diagram illustrating a camera device included in the electronic device of FIG. 24.

The image sensor may include the unit pixel illustrated with reference to FIGS. 1 to 14, and may be the image sensor illustrated with reference to FIG. 15 or FIG. 23.

Referring to FIG. 24, an electronic device 1000 may include a camera device group 1100, an application processor 1200, a power management integrated circuit (PMIC) 1300 and an external memory 1400.

The camera device group 1100 may include a plurality of camera devices 1100a, 1100b and 1100c. FIG. 24 illustrates the three camera devices 1100a, 1100b and 1100c as an example, however, embodiments are not limited to a particular number of camera devices. According to example embodiments, the camera device group 1100 may include only two camera devices, or more than three camera devices.

Hereinafter, an example configuration of the camera device 1100b is described with reference to FIG. 25, however, the same descriptions may be applied to the other camera devices 1100a and 1100c.

Referring to FIG. 25, the camera device 1100b may include a prism 1105, an optical path folding element (OPFE) 1110, an actuator 1130, an image sensing device 1140 and a storage device 1150.

The prism 1105 may include a reflection surface 1107 that may change a path of a light L incident onto the prism 1105.

In example embodiments, the prism 1105 may change the path of the light L incident in a first direction X to a second direction Y perpendicular to the first direction X. In addition, the prism 1105 may rotate the reflection surface 1107 around a center axis 1106 in A direction and/or rotate the center axis 1106 in a B direction to align the path of the reflected light along the second direction Y. The OPFE 1110 may move in a third direction Z perpendicular to the first direction X and the second direction Y.

In example embodiments, a rotation angle of the prism 1105 may be equal to or less than about 15 degrees in the positive (+) A direction and equal to or more than about 15 degrees in the negative (−) A direction, but embodiments are not limited thereto.

In example embodiments, the prism 1105 may rotate within about 20 degrees, between about 10 degrees and about 20 degrees, or between about 15 degrees to about 20 degrees in the positive or negative B direction.

In example embodiments, the prism 1105 may move the reflection surface 1107 in the third direction Z that is in parallel with the center axis 1106.

The OPFE 1110 may include optical lenses that are divided into m groups where m is a positive integer. The m lens group may move in the second direction Y to change an optical zoom ratio of the camera device 1100b. For example, the optical zoom ratio may be changed in a range of 3K, 5K, and so on by moving the m lens group, when K is a basic optical zoom ratio of the camera device 1100b.

The actuator 1130 may move the OPFE 1110 or the optical lens to a specific position. For example, the actuator 1130 may adjust the position of the optical lens for accurate sensing such that an image sensor 1142 may be located at a position corresponding to a focal length of the optical lens.

The image sensing device 1140 may include the image sensor 1142, a control logic 1144 and a memory 1146. The image sensor 1142 may be substantially the same as or similar to that of FIG. 15 or FIG. 23, and may capture or sense an image using the light L provided through the optical lens. The control logic 1144 may control overall operations of the camera device 1100b. For example, the control logic 1144 may provide control signals through control signal line CSLb to control the operation of the camera device 1100b.

The memory 1146 may store information such as calibration data 1147 for the operation of the camera device 1100b. For example, the calibration data 1147 may include information for generation of image data based on the provided light L, such as information on the above-described rotation angle, a focal length, an optical axis, etc. If the camera device 1100b is implemented as a multi-state camera having a variable focal length depending on the position of the optical lens, the calibration data 1147 may include multiple focal length values and auto-focusing values corresponding to the multiple states.

The storage device 1150 may store the image data sensed via the image sensor 1142. The storage device 1150 may be disposed at an outside of the image sensing device 1140, and may be stacked with a sensor chip including the image sensing device 1140. The storage device 1150 may be implemented with an electrically erasable programmable read-only memory (EEPROM), but embodiments are not limited thereto.

Referring to FIGS. 24 and 25, each of the camera devices 1100a, 1100b and 1100c may include the actuator 1130. Thus, the camera devices 1100a, 1100b and 1100c may include the same or different calibration data 1147 depending on the operations of the actuators 1130.

In example embodiments, one camera device 1100b may have a folded lens structure including the above-described prism 1105 and the OPFE 1110, and the other camera devices 1100a and 1100b may have a vertical structure without the prism 1105 and the OPFE 1110, however, embodiments are not limited thereto.

In example embodiments, one camera device 1100c may be a depth camera configured to measure distance information of an object using an infrared (IR) light. In this case, the application processor 1200 may merge the distance information provided from the depth camera 1100c and image data provided from the other camera devices 1100a and 1100b to generate a three-dimensional depth image.

In example embodiments, at least two camera devices, for example, the camera devices 1100a and 1100b among the camera devices 1100a, 1100b and 1100c may have different field of views, for example, through different optical lenses.

In example embodiments, the camera devices 1100a, 1100b and 1100c may be physically separated from each other. For example, the camera devices 1100a, 1100b and 1100c may each include a dedicated image sensor 1142.

The application processor 1200 may include an image processing device 1210, a memory controller 1220 and an internal memory 1230. The application processor 1200 may be separated from the camera devices 1100a, 1100b and 1100c. For example, the application processor 1200 may be implemented as one chip and the camera devices 1100a, 1100b and 1100c may implemented as another chip or other chips.

The image processing device 1210 may include a plurality of sub processors 1212a, 1212b and 1212c, an image generator 1214 and a camera device controller 1216.

The image data generated by the camera devices 1100a, 1100b and 1100c may be provided to the sub processors 1212a, 1212b and 1212c through distinct image signal lines ISLa, ISLb and ISLc, respectively. For example, image data generated from the camera device 1100a may be provided to the sub processor 1212a through the image signal line LSLa, image data generated from the camera device 1100b may be provided to the sub processor 1212b through the image signal line LSLb, and image data generated from the camera device 1100c may be provided to the sub processor 1212c through the image signal line LSLc. The transfer of the image data may be performed using a camera serial interface (CSI) based on the mobile industry processor interface (MIPI), however, the inventive concept may not be limited thereto.

In example embodiments, one sub processor may be assigned commonly to two or more camera devices. In this case, a multiplexer may be used to transfer the image data selectively from one of the camera devices to the shared sub processor.

The image data from the sub processors 1212a, 1212b and 1212c may be provided to the image generator 1214. The image generator 1214 may generate an output image using the image data from the sub processors 1212a, 1212b and 1212c according to image generating information or a mode signal.

For example, the image generator 1214 may merge at least a portion of the image data from the camera devices 1100a, 1100b and 1100c having the different fields of view to generate the output image according to the image generating information or the mode signal. In addition, the image generator 1214 may select, as the output image, one of the image data from the camera devices 1100a, 1100b and 1100c according to the image generating information or the mode signal.

In example embodiments, the image generating information may include a zoom factor or a zoom signal. In example embodiments, the mode signal may be a signal based on a selection of a user.

When the image generating information is the zoom factor and the camera devices 1100a, 1100b and 1100c have the different field of views, the image generator 1214 may perform different operations depending on the zoom signal. For example, when the zoom signal is a first signal, the sub image generator 1214 may merge the image data from the different camera devices to generate the output image. When the zoom signal is a second signal different from the first signal, the image generator 1214 may select, as the output image, one of image data from the camera devices 1100a, 1100b and 1100c.

In example embodiments, the image generator 1214 may receive the image data of different exposure times from the camera devices 1100a, 1100b and 1100c. In this case, the image generator 1214 may perform high dynamic range (HDR) processing with respect to the image data from the camera devices 1100a, 1100b and 1100c to generate the output image having the increased dynamic range.

The camera device controller 1216 may provide control signals to the camera devices 1100a, 1100b and 1100c. The control signals generated by the camera device controller 1216 may be provided to the camera devices 1100a, 1100b and 1100c through the distinct control signal lines CSLa, CSLb and CSLc, respectively.

In example embodiments, one of the camera devices 1100a, 1100b and 1100c may be designated as a master camera according to the image generating information of the mode signal, and the other camera devices may be designated as slave cameras. These data may be included in the control signal, and may be provided to corresponding camera devices 1100a, 1100b and 1100c through the distinct control signal lines CSLa, CSLb and CSLc.

The camera device acting as the master camera may be changed according to the zoom factor or an operation mode signal. For example, when the camera device 1100a has the wider field of view than the camera device 1100b and the zoom factor indicates a lower zoom magnification, the camera device 1100b may be designated as the master camera. In contrast, when the zoom factor indicates a higher zoom magnification, the camera device 1100a may be designated as the master camera.

In example embodiments, the control signals provided from the camera device controller 1216 may include a synchronization (sync) enable signal. For example, if the camera device 1100b is the master camera and the camera devices 1100a and 1100c are the slave cameras, the camera device controller 1216 may provide the sync enable signal to the camera device 1100b. The camera device 1100b may generate a sync signal based on the provided sync enable signal and provide the sync signal to the camera devices 1100a and 1100c through a sync signal line SSL. As such, the camera devices 1100a, 1100b and 1100c may transfer the synchronized image data to the application processor 1200 based on the sync signal.

In example embodiments, the control signals provided from the camera device controller 1216 may include information on the operation mode. The camera devices 1100a, 1100b and 1100c may operate in a first operation mode or a second operation mode based on the information from the camera device controller 1216.

In the first operation mode, the camera devices 1100a, 1100b and 1100c may generate image signals with a first speed (e.g., a first frame rate) and encode the image signals with a second speed higher than the first speed (e.g., a second frame rate higher than the first frame rate) to transfer the encoded image signals to the application processor 1200. The second speed may be lower than thirty times the first speed. The application processor 1200 may store the encoded image signals in the internal memory 1230 or the external memory 1400. The application processor 1200 may read out and decode the encoded image signals to provide display data to a display device. For example, the sub processors 1212a, 1212b and 1212c may perform the decoding operation and the image generator 1214 may process the decoded image signals.

In the second operation mode, the camera devices 1100a, 1100b and 1100c may generate image signals with a third speed lower than the first speed (e.g., the third frame rate lower than the first frame rate) to transfer the generated image signals to the application processor 1200. For example, the image signals that are not encoded may be provided to the application processor 1200. The application processor 1200 may process the received image signals or store the receive image signals in the internal memory 1230 or the external memory 1400.

The internal memory 1230 may be controlled by the memory controller 1220.

The PMIC 1300 may provide a power supply voltage to the camera devices 1100a, 1100b and 1100c, respectively. For example, the PMIC 1300 may provide, under control of the application processor 1200, a first power to the camera device 1100a through a power line PSLa, a second power to the camera device 1100b through a power line PSLb, and a third power to the camera device 1100c through a power line PSLc.

The PMIC 1300 may generate the power respectively corresponding to the camera devices 1100a, 1100b and 1100c and control power levels, in response to a power control signal PCON from the application processor 1200. The power control signal PCON may include information on the power depending on the operation modes of the camera devices 1100a, 1100b and 1100c. For example, the operation modes may include a relatively low power mode in which the camera devices 1100a, 1100b and 1100c operate in relatively low powers. The power levels of the camera devices 1100a, 1100b and 1100c may be the same as or different from each other. In addition, the power levels may be changed dynamically or adaptively.

While example embodiments have been described with reference to the figures, it will be understood by those of ordinary skill in the art that various changes in form and details may be made therein without departing from the spirit and scope as defined by the following claims, and their equivalents.

What is claimed is:

1. An image sensor comprising:
 a light sensing element in a substrate;
 a plurality of transfer gates (TGs) spaced apart from each other in a horizontal direction substantially parallel to a surface of the substrate, each of the plurality of TGs extending through a portion of the substrate and contacting the light sensing element;
 a floating diffusion (FD) region at a portion of the substrate adjacent to the plurality of TGs;
 a first division pattern extending at least partially through the substrate in a vertical direction substantially perpendicular to the surface of the substrate, the first division pattern having a first closed shape in a plan view;

a second division pattern connected to the first division pattern and extending from the first closed shape toward an outside of the first closed shape in a horizontal direction to form a second closed shape adjacent to the first closed shape in the plan view; and a third division pattern connected to the first division pattern and extending from the first closed shape toward a center of the first closed shape, wherein the FD region is between the plurality of TGs in a plan view.

2. The image sensor of claim 1, wherein the light sensing element is one of a plurality of light sensing elements spaced apart from each other in the horizontal direction, and wherein the plurality of TGs contact the plurality of light sensing elements, respectively.

3. The image sensor of claim 1, wherein the light sensing element, the plurality of TGs and the FD region are in each of a unit pixel regions.

4. The image sensor of claim 1, wherein the third division pattern is one of four third division patterns spaced apart from each other in the horizontal direction, and wherein the light sensing element is in each region corresponding to the first division pattern and corresponding two of the four third division patterns.

5. The image sensor of claim 4, wherein the plurality of TGs and the FD region are at a central region of the first closed shape.

6. The image sensor of claim 3, wherein the first division pattern extends through the substrate in the vertical direction, the first division pattern including:

a core extending in the vertical direction; and a shell covering a sidewall of the core in the horizontal direction.

7. The image sensor of claim 6, wherein the core includes polysilicon, and the shell includes silicon oxide.

8. The image sensor of claim 6, wherein the light sensing element is a first impurity region in which first conductivity type impurities are doped, and wherein the image sensor further comprises a second impurity region in which second conductivity type impurities are doped, the second conductivity type being different from the first conductivity type.

9. The image sensor of claim 3, wherein the first division pattern extends partially through the substrate in the vertical direction.

10. The image sensor of claim 9, wherein the first division pattern includes a metal oxide.

11. The image sensor of claim 3, wherein at least one additional light sensing element, at least one additional TG and at least one additional FD region are in a region corresponding to an inside of the second closed shape in a plan view.

12. The image sensor of claim 11, wherein an area of the second closed shape is less than an area of the first closed shape.

13. The image sensor of claim 11, wherein a reset transistor, a source follower transistor and a select transistor are in a region corresponding to an inside of the first closed shape in a plan view.

14. The image sensor of claim 12, wherein one additional light sensing element, one additional TG and one additional FD region are in the region corresponding to the inside of the second closed shape in a plan view.

15. The image sensor of claim 1, further comprising a color filter and a microlens stacked in a vertical direction, the color filter and the microlens overlapping the light sensing element in the vertical direction.

16. An image sensor comprising:

a light sensing element in a substrate;

a transfer gate (TG) extending through a portion of the substrate and contacting the light sensing element, the TG having a ring shape in a plan view;

a floating diffusion (FD) region at a portion of the substrate adjacent to the TG;

a first division pattern extending at least partially through the substrate in a vertical direction substantially perpendicular to the surface of the substrate, the first division pattern having a first closed shape in a plan view;

a second division pattern connected to the first division pattern and extending from the first closed shape toward an outside of the first closed shape in a horizontal direction to form a second closed shape adjacent to the first closed shape in the plan view; and a third division pattern connected to the first division pattern and extending from the first closed shape toward a center of the first closed shape, wherein the FD region is at an inside of the TG in a plan view.

17. The image sensor of claim 16, wherein the light sensing element is one of a plurality of light sensing elements spaced apart from each other in a horizontal direction substantially parallel to a surface of the substrate, and wherein the TG contacts the plurality of light sensing elements.

18. An image sensor comprising:

a plurality of light sensing elements in a substrate, the plurality of light sensing elements being spaced apart from each other in a horizontal direction substantially parallel to a surface of the substrate;

one or a plurality of transfer gates (TGs) spaced apart from each other, the one or each one of the plurality of TGs extending through a portion of the substrate and directly contacting the plurality of light sensing elements commonly or respectively; and a floating diffusion (FD) region at a portion of the substrate adjacent to the one or the plurality of TGs;

a first division pattern extending at least partially through the substrate in a vertical direction substantially perpendicular to the surface of the substrate, the first division pattern having a first closed shape in a plan view;

a second division pattern connected to the first division pattern and extending from the first closed shape toward an outside of the first closed shape in a horizontal direction to form a second closed shape adjacent to the first closed shape in the plan view; and a third division pattern connected to the first division pattern and extending from the first closed shape toward a center of the first closed shape, wherein a cross-section of the FD region in a vertical direction substantially perpendicular to the surface of the substrate is at an inside of the one TG or between the plurality of TGs.

19. The image sensor of claim 18, wherein the plurality of light sensing elements, the one or the plurality of TGs, and the FD region are in each of a unit pixel regions.

* * * * *